(12) United States Patent
Teysseyre et al.

(10) Patent No.: US 11,502,027 B2
(45) Date of Patent: Nov. 15, 2022

(54) PACKAGE INCLUDING MULTIPLE SEMICONDUCTOR DEVICES

(71) Applicant: SEMICONDUCTOR COMPONENTS INDUSTRIES, LLC, Phoenix, AZ (US)

(72) Inventors: Jerome Teysseyre, Scottsdale, AZ (US); Maria Cristina Estacio, Lapulapu (PH); Seungwon Im, Seoul (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 107 days.

(21) Appl. No.: 17/248,541

(22) Filed: Jan. 28, 2021

(65) Prior Publication Data

US 2021/0151367 A1    May 20, 2021

Related U.S. Application Data

(60) Continuation of application No. 16/429,366, filed on Jun. 3, 2019, now Pat. No. 10,910,297, which is a
(Continued)

(51) Int. Cl.
*H01L 23/495* (2006.01)
*H01L 23/31* (2006.01)
(Continued)

(52) U.S. Cl.
CPC ........ *H01L 23/49575* (2013.01); *H01L 21/56* (2013.01); *H01L 23/3107* (2013.01); *H01L 23/3121* (2013.01); *H01L 23/3135* (2013.01); *H01L 23/3735* (2013.01); *H01L 23/4334* (2013.01); *H01L 23/473* (2013.01); *H01L 23/49524* (2013.01); *H01L 23/49531* (2013.01); *H01L 23/49562* (2013.01); *H01L 23/49568* (2013.01); *H01L 24/34* (2013.01); *H01L 24/40* (2013.01); *H01L 29/1608* (2013.01);
(Continued)

(58) Field of Classification Search
CPC combination set(s) only.
See application file for complete search history.

(56) References Cited

U.S. PATENT DOCUMENTS 5,543,740 A    8/1996  Wong
6,323,549 B1  11/2001  deRochemont et al.
(Continued)

OTHER PUBLICATIONS

Partial Search Report and Invitation to Pay Additional Search Fees for European Application No. 18197397.5, dated Mar. 14, 2019, 17 pages.
(Continued)

*Primary Examiner* — Thao P Le
(74) *Attorney, Agent, or Firm* — Brake Hughes Bellermann LLP

(57) ABSTRACT

In a general aspect, an apparatus can include an inner package including a first silicon carbide die having a die gate conductor coupled to a common gate conductor, and a second silicon carbide die having a die gate conductor coupled to the common gate conductor. The apparatus can include an outer package including a substrate coupled to the common gate conductor, and a clip coupled to the inner package and coupled to the substrate.

20 Claims, 25 Drawing Sheets

Related U.S. Application Data division of application No. 15/789,254, filed on Oct. 20, 2017, now Pat. No. 10,319,670.

(51) Int. Cl.
*H01L 21/56* (2006.01)
*H01L 23/373* (2006.01)
*H01L 23/433* (2006.01)
*H01L 23/473* (2006.01)
*H01L 23/00* (2006.01)
*H01L 29/16* (2006.01)

(52) U.S. Cl.
CPC ............... *H01L 2224/40111* (2013.01); *H01L 2224/40137* (2013.01); *H01L 2224/40245* (2013.01); *H01L 2924/10272* (2013.01); *H01L 2924/1203* (2013.01); *H01L 2924/13055* (2013.01); *H01L 2924/13091* (2013.01)

(56) References Cited

U.S. PATENT DOCUMENTS

| | | | |
|---|---|---|---|
| 7,047,637 B2 | 5/2006 | deRochemont et al. | |
| 7,068,097 B2 | 6/2006 | Atmur | |
| 7,227,198 B2 | 6/2007 | Pavier et al. | |
| 7,301,235 B2 | 11/2007 | Schaffer et al. | |
| 7,425,757 B2 | 9/2008 | Takubo | |
| 7,492,043 B2 | 2/2009 | Choi et al. | |
| 7,675,148 B2 | 3/2010 | Lim et al. | |
| 7,736,397 B2 | 6/2010 | Lee et al. | |
| 8,198,139 B2 | 6/2012 | Yang | |
| 8,604,611 B2 | 12/2013 | Hauenstein | |
| 8,963,303 B2 | 2/2015 | Stella et al. | |
| 2006/0065923 A1* | 3/2006 | Pfirsch | H01L 29/41 |
| | | | 257/E29.112 |
| 2008/0023807 A1 | 1/2008 | Noquil et al. | |
| 2010/0065954 A1 | 3/2010 | Tu et al. | |
| 2011/0260314 A1 | 10/2011 | Minotti et al. | |
| 2012/0049902 A1 | 3/2012 | Corona et al. | |
| 2013/0099364 A1 | 4/2013 | Liu et al. | |
| 2013/0161801 A1 | 6/2013 | Otremba et al. | |
| 2014/0252579 A1 | 9/2014 | Chang et al. | |
| 2016/0247751 A1 | 8/2016 | Kinzer | |
| 2019/0122970 A1* | 4/2019 | Teysseyre | H01L 24/40 |
| 2019/0206993 A1 | 7/2019 | Pillarisetty et al. | |
| 2019/0355633 A1* | 11/2019 | Liu | H01L 23/62 |
| 2021/0313284 A1* | 10/2021 | Noori | H01L 25/072 |
| 2021/0375856 A1* | 12/2021 | Alcorn | H01L 23/481 |

OTHER PUBLICATIONS

Extended European Search Report for European Application No. 18197397.5, dated Aug. 6, 2019, 13 pages.
U.S. Appl. No. 15/789,254, filed Oct. 20, 2017, Patented.
U.S. Appl. No. 16/429,366, filed Jun. 3, 2019, Allowed.

\* cited by examiner

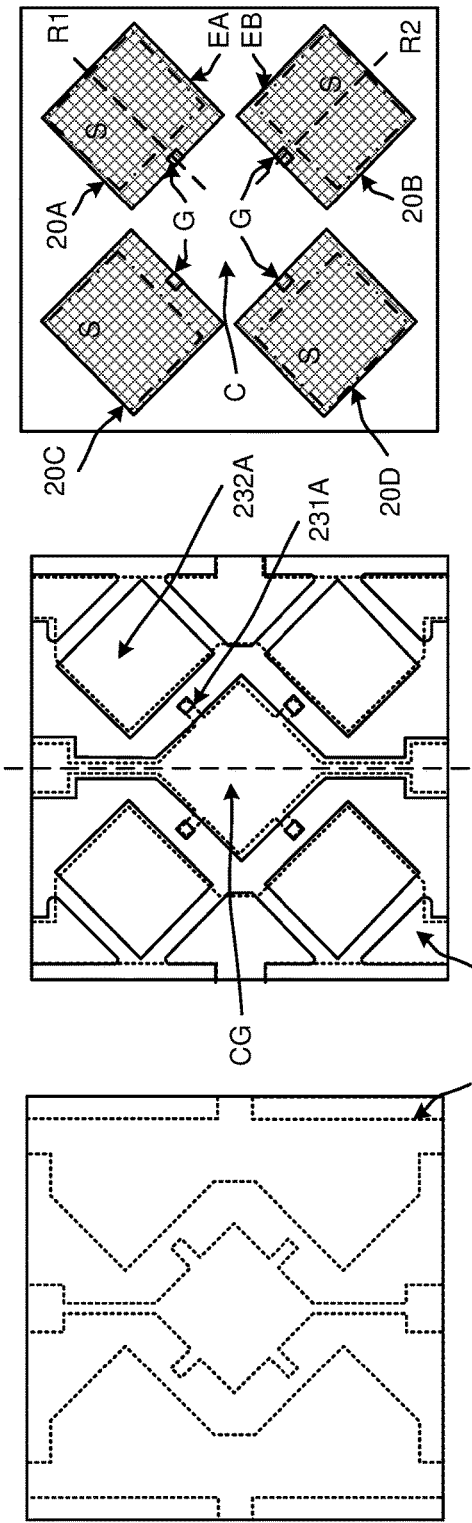

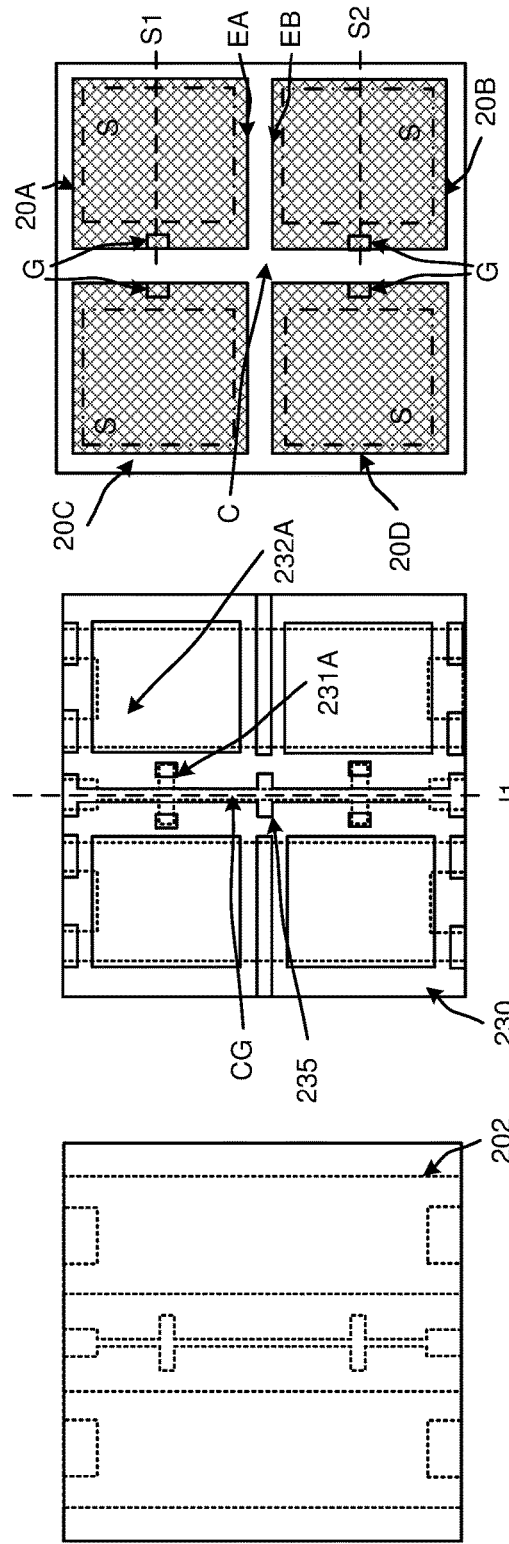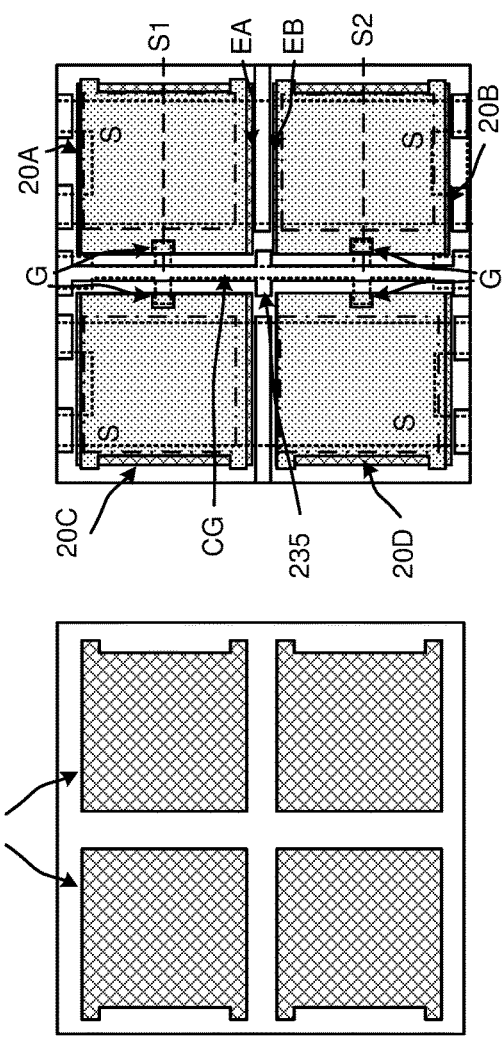

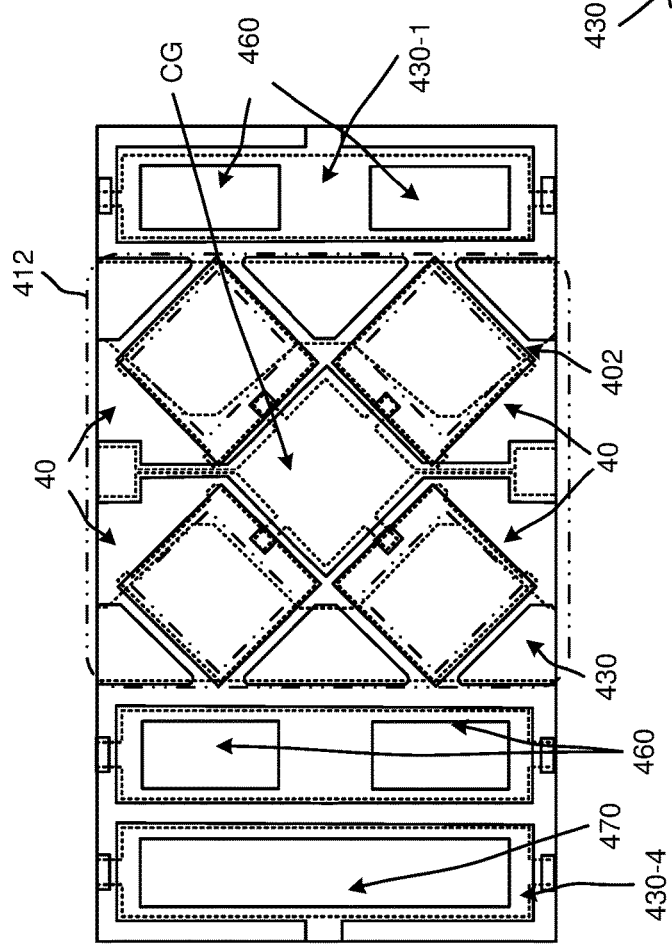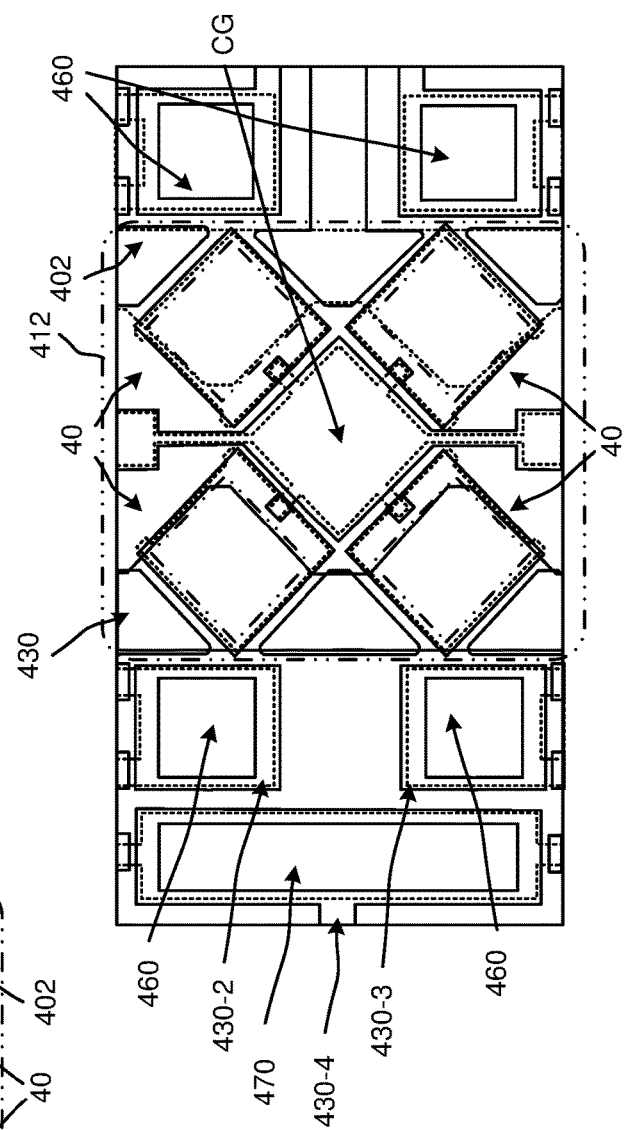

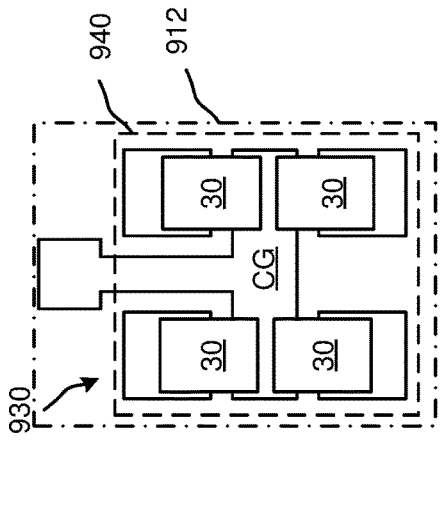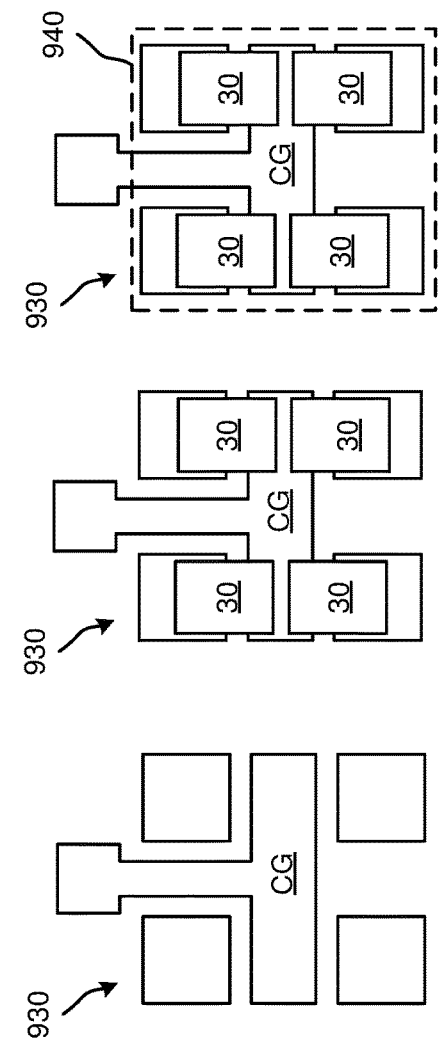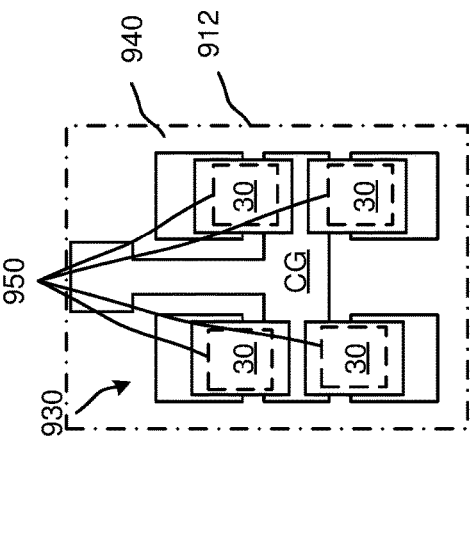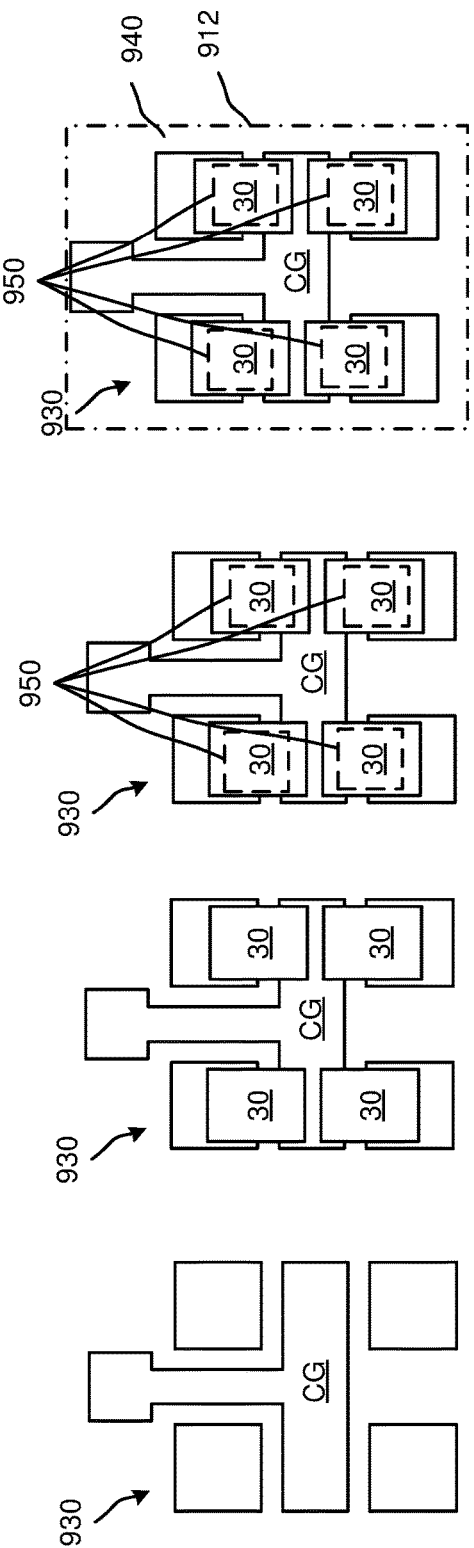

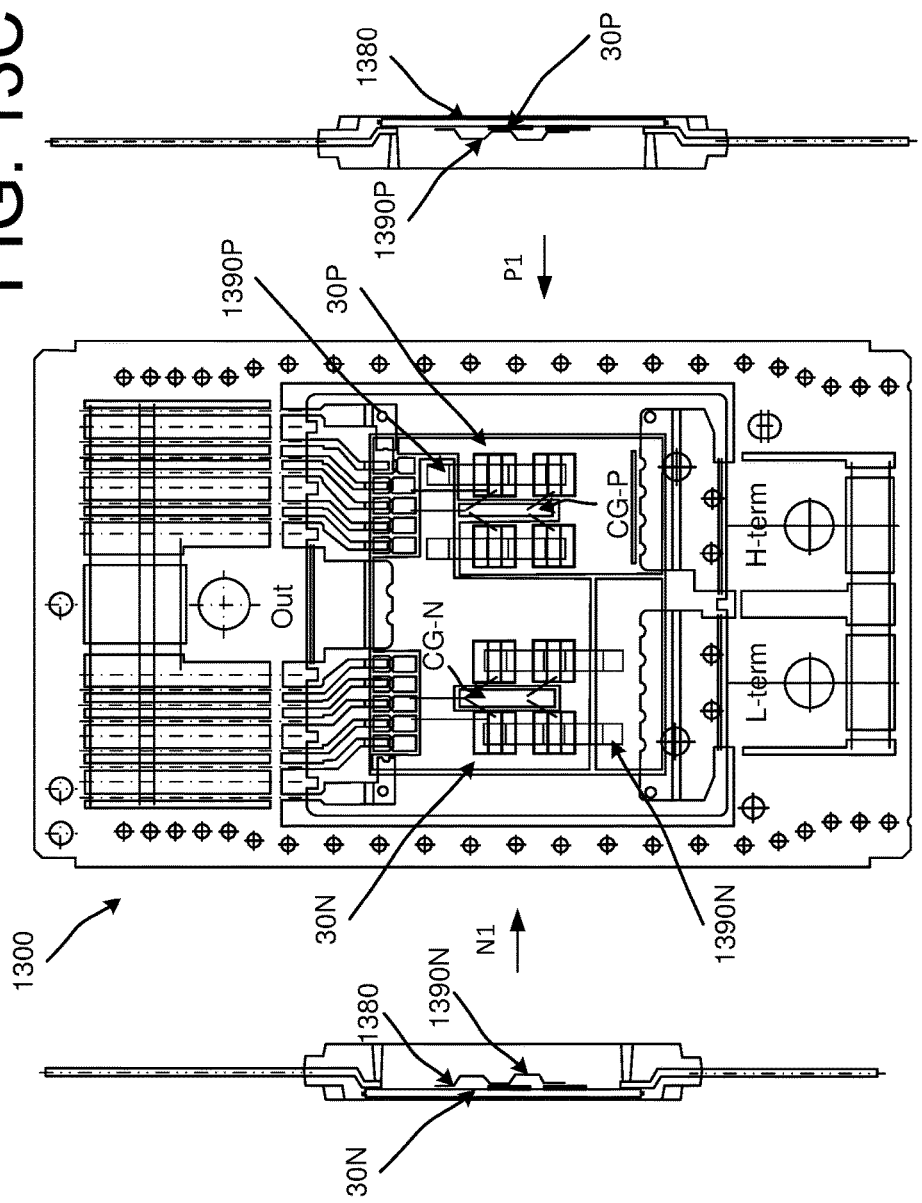
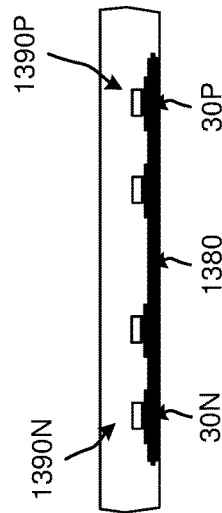

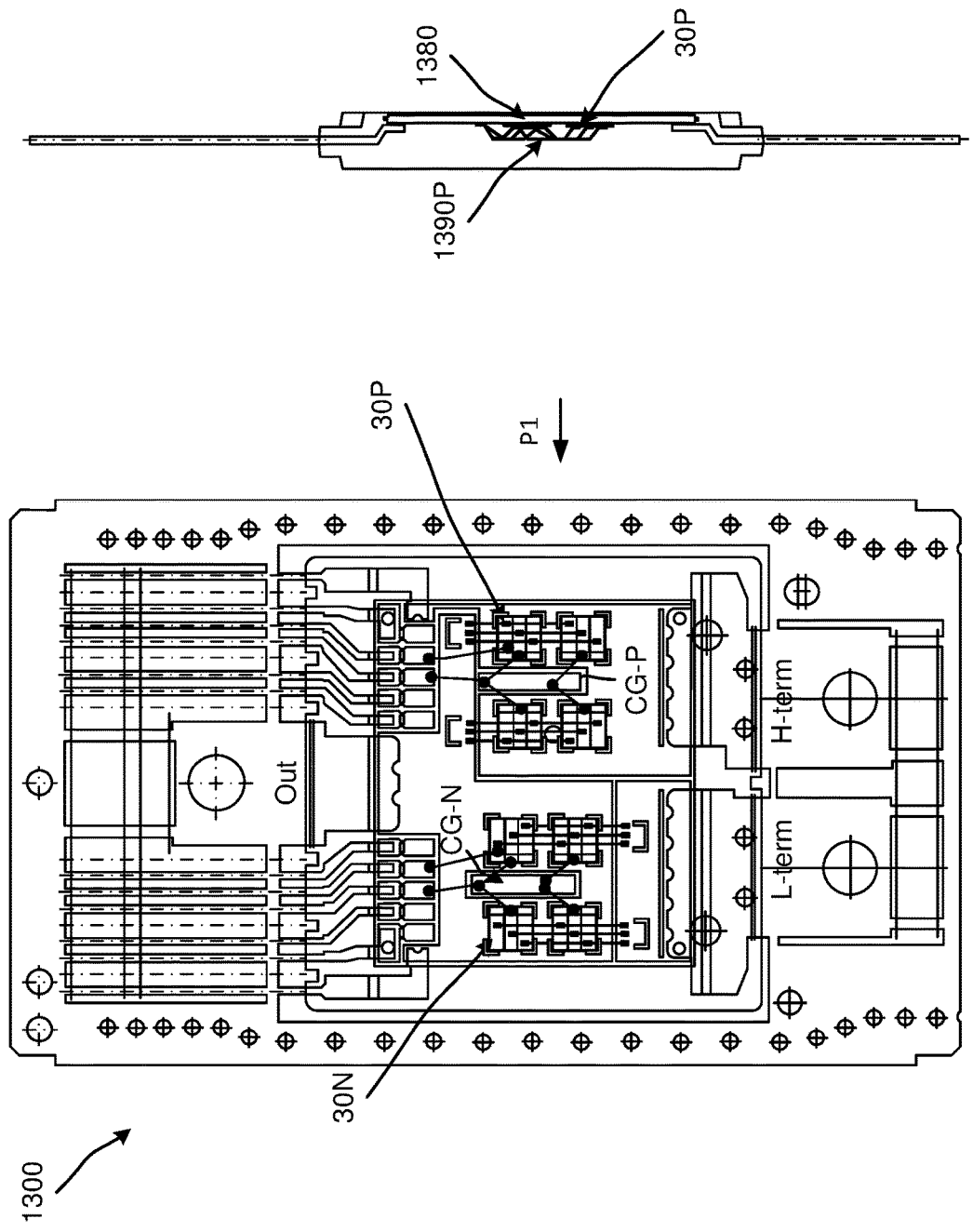

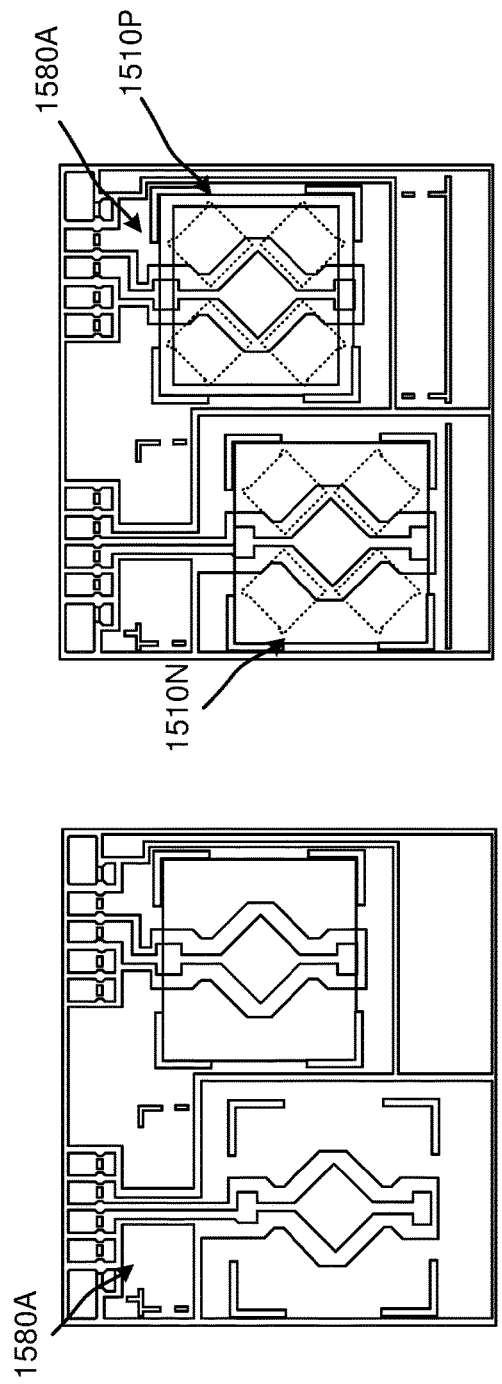
FIG. 15E
FIG. 15D
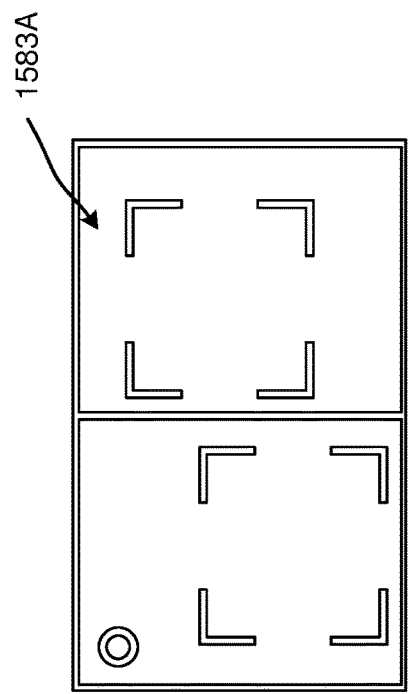
FIG. 16D
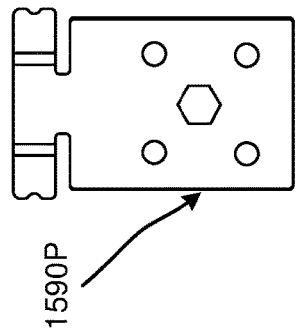
FIG. 15G
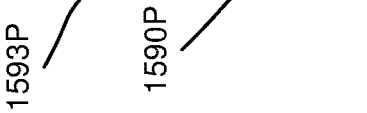
FIG. 15F

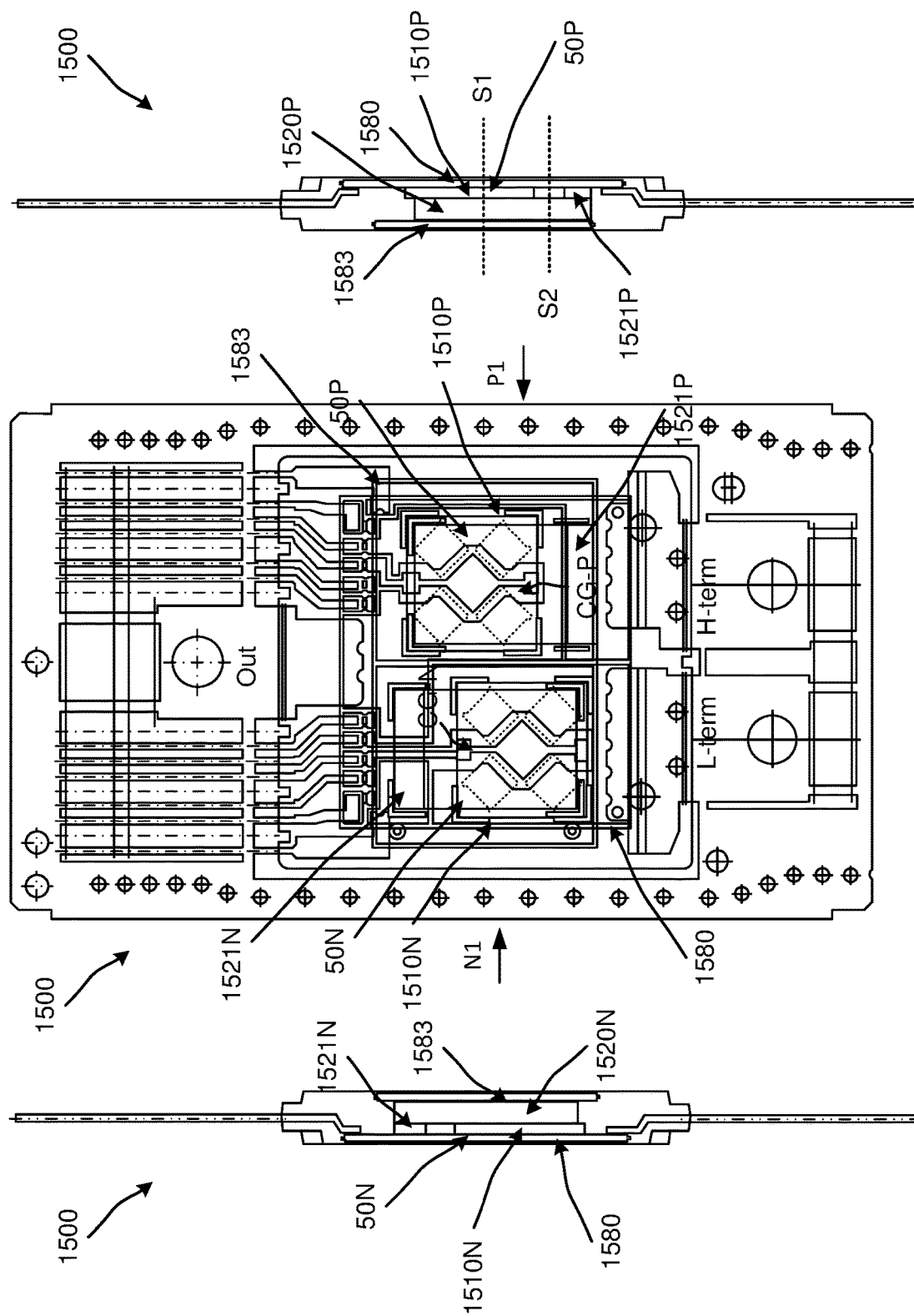

PACKAGE INCLUDING MULTIPLE SEMICONDUCTOR DEVICES

RELATED APPLICATIONS

This application is a continuation of U.S. application Ser. No. 16/429,366 (Now U.S. Pat. No. 10,910,297), filed on Jun. 3, 2019, which is a divisional of U.S. application Ser. No. 15/789,254 (Now U.S. Pat. No. 10,319,670), filed on Oct. 20, 2017, both of which are incorporated by reference herein in their entireties.

TECHNICAL FIELD

This description relates to a package including a semiconductor device.

BACKGROUND

As the world of electronics moves towards smaller sizes, higher efficiency, and lower cost, integration techniques are in great demand for making smaller, more intelligent and more efficient products, in a variety of spaces including the power management space. The highest performance devices, such as power devices, are often manufactured discretely as opposed to being integrated in an integrated circuit (IC) process. The cost of producing such discrete devices can be a fraction of those produced using such complex processes because the mask layers used in discrete devices are generally a fraction (e.g., one half, one third) of the number of those used in more complex IC processes. Many known approaches have used, for example, leadframe packages and copper clips to achieve integration, but the shortcomings of such packages have been higher cost, inferior thermal performance, higher inductance, larger size and generally a lower level of integration. Thus, a need exists for systems, methods, and apparatus to address the shortfalls of present technology and to provide other new and innovative features.

SUMMARY

In a general aspect, an apparatus can include an inner package including a first silicon carbide die having a die gate conductor coupled to a common gate conductor, and a second silicon carbide die having a die gate conductor coupled to the common gate conductor. The apparatus can include an outer package including a substrate coupled to the common gate conductor, and a clip coupled to the inner package and coupled to the substrate.

BRIEF DESCRIPTION OF THE DRAWINGS

FIGS. 2A through 2D are diagrams that illustrate various plan views of components of an inner package.

FIG. 2E is a diagram that illustrates a plan view of the components shown in FIGS. 2A through 2D in a composite stack.

FIGS. 3A through 3D are diagrams that illustrate various plan views of components of a variation of an inner package.

FIG. 3E is a diagram that illustrates a plan view of the components shown in FIGS. 3A through 3D in a composite stack.

FIG. 5C is a diagram that illustrates a plan view of variation of the components of the inner package shown in FIG. 5A.

FIG. 5D is a diagram that illustrates a plan view of variation of the components of the inner package shown in FIG. 5B.

FIGS. 9A through 9D illustrates a method of manufacturing at least a portion of the inner packages described herein.

FIGS. 10A through 10D illustrates a variation of the method of manufacturing shown in FIGS. 9A through 9D.

FIGS. 13A through 13D are diagrams that illustrate various views of a module.

FIGS. 14A and 14B are diagrams that illustrate various views of a variation of the module.

FIGS. 15A through 15G are diagrams that illustrate various views and components of a module.

FIGS. 16A through 16D are diagrams that illustrate various views of a variation of the module shown and described in connection with FIGS. 15A through 15G.

FIGS. 17A through 17E are diagrams that illustrate various views of a variation of the module shown and described in connection with FIGS. 15A through 16D.

DETAILED DESCRIPTION

Figure 1A:
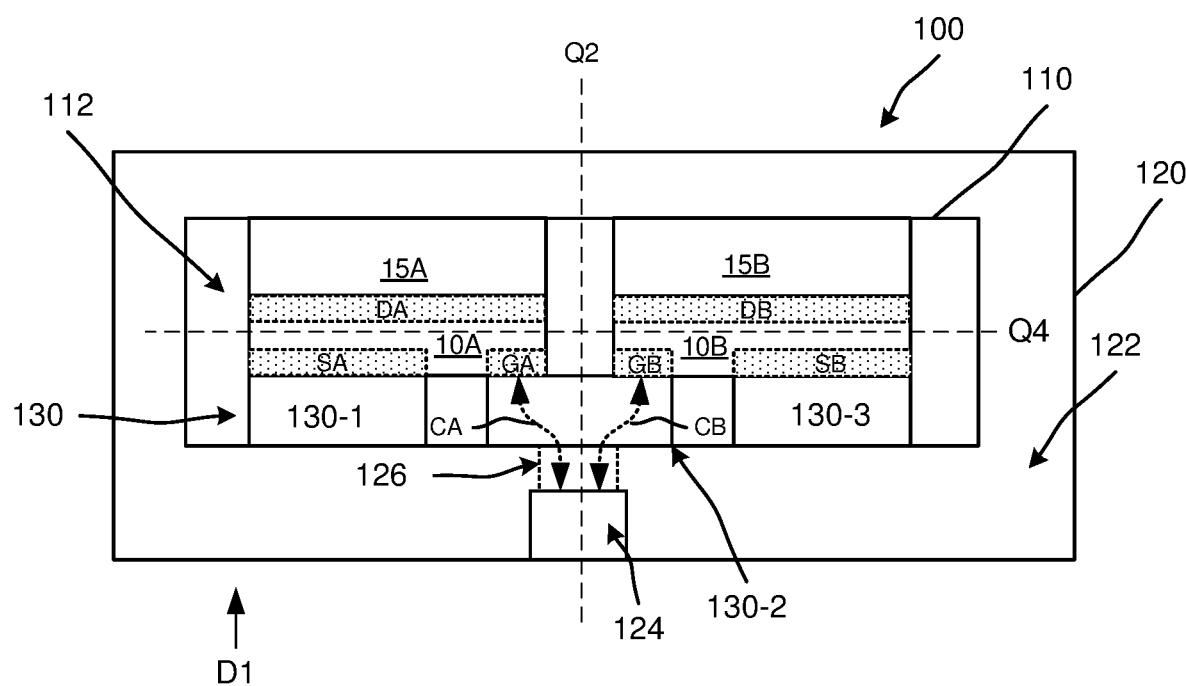
FIG. 1A is a diagram that illustrates a side cross-sectional view of a module including a package disposed within a package.

In some implementations, a module can include multiple semiconductor die (e.g., silicon carbide (SiC) semiconductor die, insulated-gate bipolar transistors (IGBTs), metal-oxide-semiconductor field effect transistor (MOSFET) die), and the module can be configured so that the multiple semiconductor die included in the module can be switched at approximately the same time. Specifically, the leadframe, electrical connections, and/or orientation of the semiconductor die can be configured so that the switching of the semiconductor die can be robust even at relatively high frequencies. In some implementations, the semiconductor die can be, or can include, silicon carbide semiconductor die. In some implementations, the module can be a dual cool module with a first substrate on the first side of the multiple semiconductor die and a second substrate on a second side of the multiple semiconductor die.

The modules described herein can be used in applications with high voltages (e.g., higher than 600 V), high current densities (e.g., between 100 A to 800 A (e.g., 400 A)), and high switching frequencies (e.g., greater than 1 kHz). Silicon carbide die can be particularly advantageous for use in the high voltage applications given the bandgap voltages of silicon carbide devices. Because of the current densities, the sizes of a single die to handle the current densities may be very large. Given the high cost and relatively low yield of single large die (especially in the case of silicon carbide die), using multiple die may be desirable, and in some cases, necessary. As mentioned above, the leadframe, electrical connections, and/or orientation of the semiconductor die can be configured so that the switching of the silicon carbide die can be robust even at relatively high frequencies.

In some implementations, the modules described herein can be, or can include, multichip common gate/source down low profile package. In some implementations, the modules described an assembly process that enables the creation of, for example, a flexible and low cost SiC wireless power module assembly.

The modules, and assembly methodologies described herein (e.g., with individual die and/or spacers), can be less complex than known assembly methodologies. The modules, and assembly methodologies described herein, can have desirable tilt control, high yield and/or desirable stress/reliability compared with known assembly methodologies. In some implementations, the modules described herein can be compatible with a sintering process (e.g., a silver sintering process) where interfaces between components (e.g., between a leadframe and a semiconductor die) are formed using a sintered material and process (which can be included in a bonding layer).

The module can be included in a variety of applications including, for example, high power device applications (e.g., high power applications greater than 600 V (especially when using silicon carbide die), high power applications greater than 400 V (e.g., when using silicon die)). In some implementations, the module can be included in a variety of applications including, for example, automotive applications (e.g., automotive high power module (AHPM), electrical vehicles, hybrid electrical vehicles), computer applications, industrial equipment, on-board charging applications, inverter applications, and/or so forth.

Figure 1B:
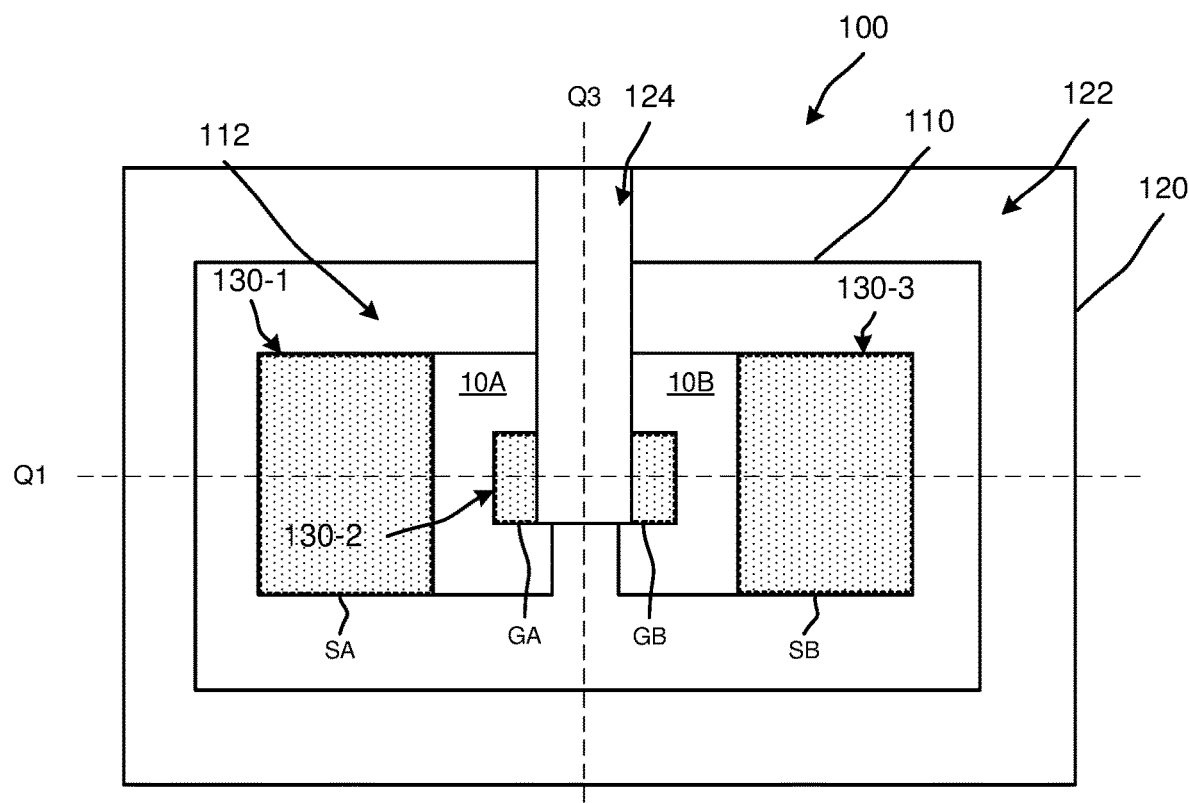
FIG. 1B is a bottom view of the module shown in FIG. 1A.

FIG. 1A is a diagram that illustrates a side cross-sectional view of module 100 including a package 110 (e.g., an inner package, sub-module) disposed within a package 120 (e.g., outer package). The cross-section is cut along line Q1 shown in FIG. 1B. FIG. 1B is a bottom view of the module viewed along the direction D1 shown in FIG. 1A. The elements included in the inner package 110 and the outer package 120 have been simplified for description purposes. Although illustrated as including a single inner package, in some implementations, the module 100 can include multiple inner packages. Accordingly, the outer package 120 can include more than one inner package (e.g., inner package 110).

As shown in FIG. 1A, the inner package 110 includes semiconductor die 10A, 10B. The semiconductor die 10A, 10B are each coupled to (e.g., electrically coupled to, directly coupled to, communicatively coupled to) a leadframe 130. Spacers 15A, 15B are, respectively, coupled to the semiconductor die 10A, 10B. Accordingly, each of the semiconductor die 10A, 10B are disposed between the spacers 15A, 15B, and the leadframe 130. The semiconductor die 10A, 10B are aligned along the same plane Q4.

Although the inner package 110 is illustrated and described as including only two semiconductor die, the inner package 110 can include more than two semiconductor die (e.g., 3 semiconductor die, 3 semiconductor die, 8 semiconductor die, 16 semiconductor die, etc.). In some implementations, the semiconductor die can be, or can include, silicon carbide semiconductor die (can be referred to as silicon carbide die). The silicon carbide die can be high power devices (e.g., greater than 600 V (e.g., 1200 V)) that are configured to switch at high frequencies (e.g., greater than 1 kHz, 10 kHz range, 100 kHz, 1 MHz). More examples of modules (and packages) including more than two semiconductor die are described below.

The leadframe 130 includes leadframe portions 130-1 through 130-2. The leadframe portion 130-1 is coupled to a source SA of the semiconductor die 10A and the leadframe portion 130-3 is coupled to a source SB of the semiconductor die 10B. The leadframe portion 130-2 is coupled to a gate GA of the semiconductor die 10A and a gate GB (also can be referred to as a die gate conductor (e.g., die gate input conductor)) of the semiconductor die 10B. Accordingly, the semiconductor die 10A and the semiconductor die 10B are electrically coupled to the same leadframe portion 130-2. The gate GA of the semiconductor die 10A and gate GB of the semiconductor die 10B can be switched (e.g., driven, triggered) via the same signal through the leadframe portion 130-2. The leadframe portion 130-2 can be referred to as a common gate conductor (e.g., common gate input conductor) because both of the gates GA, GB are coupled to the leadframe portion 130-2.

The outer package 120 includes a gate runner 124 that is electrically coupled to the leadframe portion 130-2 using a via 126. Accordingly, the semiconductor die 10A and the semiconductor die 10B are electrically coupled to through the gate runner 124 and the via 126, which is coupled to the leadframe portion 130-2. The gate GA of the semiconductor die 10A and gate GB of the semiconductor die 10B can be switched via the same signal through the gate runner 124. Moreover, the semiconductor die 10A, 10B can be connected in parallel and switched in parallel. The gate runner 124 and via 126 are illustrated with a dashed line because one or more of the elements may not be in the same plane as the cut shown in FIG. 1A (or other cuts shown herein).

In some implementations, the gate runner 124 can be included in a metal layer. In some implementations, the gate runner 124 can be included in a metal layer within a substrate (not shown). In some implementations, the gate runner 124 being conductively coupled to the common gate conductor CG and entirely included in outer package 120.

The inner package 110 (and the elements thereof) and the outer package 120 (and the elements thereof) are defined so that the semiconductor die 10A and the semiconductor die 10B can be switched simultaneously (e.g., substantially simultaneously). Specifically, the orientation of the semiconductor die 10A, 10B, the leadframe portion 130-2, the via 126, and the gate runner 124 can be defined so that the semiconductor die 10A, 10B can be switched simultaneously. The simultaneous switching can be performed within a time period (e.g., within a few microseconds (e.g., within a microsecond)) that can be significantly shorter than a period of a switching frequency. For example, the switching of the semiconductor die 10A, 10B (or more than two die in some implementations) included in the module 100 can be performed substantially simultaneously within a time period that is significantly shorter (e.g., at least 2 times shorter, 10 time shorter) than a period of the switching frequency.

As shown in FIG. 1A, a length of a conductive path CA between the gate GA of the semiconductor die 10A is the same as a length of a conductive path CB the gate GB of the semiconductor die 10B. The conductive path CA traverses both the leadframe portion 130-2 and the via 126. The conductive path CA extends from a surface (e.g., a bottom surface as oriented in FIG. 1A) of the gate GA and a surface (e.g., a top surface as oriented in FIG. 1A) of the gate runner 124. The conductive path CB is configured in a fashion that mirrors the conductive path CA.

The gate runner 124, as shown in FIG. 1A by the dashed line Q2, is centered between the gates GA, GB. A first portion of the gate runner 124 is disposed below the gate GA and a second portion of the gate runner 124 is disposed below the gate GB.

As shown in FIG. 1A, both of the semiconductor die 10A, 10B are oriented in the same direction. Specifically, the gates GA, GB and the sources SA, SB of the semiconductor die 10A, 10B, respectively, are facing in a downward direction and are coupled to the leadframe 130. The gates GA, GB and the sources SA, SB are on a bottom side of the respective semiconductor die 10A, 10B.

Drains DA, DB of the respective semiconductor die 10A, 10B are facing in an upward direction are on a top side of the respective semiconductor die 10A, 10B. The drains DA, DB are coupled to conductive spacers 15A, 15B. One or more of the spacers 15A, 15B can be exposed through a top surface of a molding 112 of the inner package 110. In some implementations (although not shown), one or more of the spacers 15A, 15B can be exposed so that one or more components of the outer package 120 can be conductively coupled to one or more of the spacers 15A, 15B. Many embodiments of this application are discussed in terms of a molding 112, but in some implementations, any type of insulator can be used such as an epoxy, a molding, a potting, and/or so forth.

In some implementations, the spacers 15A, 15B can be implemented as a single spacer or as more than two spacers. In some implementations, the number of spacers can be less than or more than the number of semiconductor die. In some implementations, the spacer can include copper or can include a copper material. In some implementations, the spacer can be or can include copper molybdenum.

Although not shown, in some implementations, the inner package 110 can exclude a spacer. In such implementations, a top side of one or more of the semiconductor die 10A, 10B (or a conductive layer coupled to one or more of the semiconductor die 10A, 10B) can be exposed through the molding 112.

In some implementations, a clip (not shown) can be disposed within the inner package 110. In such implementations, a first portion of (e.g., a bottom surface of) a clip can be coupled to the top surface of one or more of the semiconductor die 10A, 10B. A second portion of the clip can be exposed through a bottom surface of the inner package 110. More details regarding such an implementation are described in connection with FIGS. 6 and 7.

As shown in FIG. 1A, the semiconductor die 10A, 10B and the spacers 15A, 15B are at least partially encapsulated within the molding 112 of the inner package 110. In this implementation, the inner package 110 is entirely encapsulated within the molding 122 of the outer package 120.

As shown in FIG. 1B by the dashed line Q3, the gate runner 124 is centered between the gates GA, GB. Specifically, a distance between the gate GA (e.g., an inner edge facing the dashed line Q3) and the dashed line Q3 is the same as a distance between the gate GB (e.g., an inner edge facing the dashed line Q3) and the dashed line Q3. A side of the semiconductor die 10A including the gate GA is facing (e.g., directly facing, without an intervening portion of semiconductor die) a side of the semiconductor die 10B including the gate GB.

The sources SA, SB of the respective semiconductor die 10A, 10B are further away from the gate runner 124 than the gates GB, GA. Specifically, the sources SA, SB of the semiconductor die 10A, 10B are on the far side of the respective semiconductor die 10A, 10B (relative to the gates GA, GB) as shown in FIG. 1B.

The semiconductor die 10A, 10B can be, or can include, a high-side transistor or a low-side transistor. For example, both of the semiconductor die 10A, 10B can be a high-side transistor.

In some implementations, the module 100 described herein can be compatible with a sintering process (e.g., a silver sintering process) where interfaces between components (e.g., between the leadframe 130 and the semiconductor die 10A, 10B) are formed using a sintered material and process. In some implementations, sintered interfaces, which can involve the coalescing of a solid material under heat and high pressure, can be desirable with the high junctions temperatures associated with silicon carbide die. Sintered interfaces can have desirable thermal performance, reliability, and/or temperature coefficients (relative to, for example, a soldered and re-flowed interface).

The package-in-package configuration shown in FIG. 1A can be particularly compatible with sintered interfaces. Specifically, the package-in-package configuration shown in FIG. 1A can result in interfaces within the inner package 110 (e.g., interfaces between semiconductor die 10A, 10B and spacers 15A, 15B, interfaces between semiconductor die 10A, 10B and leadframe portions 130) that can be isolated (e.g., separated) during processing from the interfaces formed within the outer package 120 (e.g., interfaces between leadframe portions 130 and via 126, interfaces between via 126 and gate runner 124). Accordingly, the module 100 can have desirable tilt control, high yield and/or desirable stress/reliability. The package-in-package configuration has advantages over a single package stack that can include multiple stacked interfaces (e.g., more than five stacked interfaces) between a stack of components that may also be formed using a solder and reflow process.

In some implementations, the conductive portions illustrated as part of the leadframe 130 can be disposed outside of the inner package 110. In some implementations, the conductive portions illustrated as part of the leadframe 130 can be included in a substrate (not shown in FIG. 1A or 1B).

In some implementations, a diode device (e.g., a diode semiconductor device) can be included in the inner package 110 in addition to the semiconductor die 10A, 10B. The diode devices can be included in the module 100 in situations where a body diode included in a transistor device of the semiconductor die 10A, 10B is not sufficient for a particular circuit application. In some implementations, the module 100 can include multiple diode devices. In some implementations, the module 100 can include a 1:1 ratio of diode devices and transistor devices. In some implementations, the module 100 can include more or less than a 1:1 (e.g., 1:2, 2:1) ratio of diode devices and transistor devices.

Although not shown in FIG. 1A or 1B, the module 100 can include multiple substrates. For example, in some implementations, the module 100 can be a dual cool module with a first substrate (not shown) on the first side of (e.g., above) the semiconductor die 10A, 10B (and inner package 110) and a second substrate (not shown) on a second side of (e.g., below) the semiconductor die 10A, 10B (and inner package 110). More details related to multiple substrates are described in connection with at least some of the figures below.

FIGS. 2A through 2D are diagrams that illustrate various plan views of components (e.g., layers) of an inner package. FIG. 2E is a diagram that illustrates a plan view of the components shown in FIGS. 2A through 2D in a composite stack. In these figures, some of the components are shown as being transparent so that the elements can be viewed. The components of the composite stack are ordered as descried in connection with, for example, FIGS. 1A and 1B. The views illustrate a layout (e.g., a pattern) of the components of the inner package. FIGS. 2A through 2E are directed to a four (4) semiconductor die (e.g., MOSFETs) configuration where gate-side edges of the semiconductor die are in a diamond-shaped layout (can be referred to as a diamond configuration). In some views, only some portions are labeled for a subset of the semiconductor die.

FIG. 2A illustrates a plan view of a footprint 202 (in dashed lines) that roughly corresponds with a shape of a leadframe 230 (shown in FIG. 2B). In some implementations, the footprint 202 can correspond with a shape of a layout within a metal (e.g., copper) included on a directed bonded metal substrate (e.g., a directed bonded copper (DBC) substrate). The footprint 202 can be a bottom-side footprint of the inner package after molding. The footprint 202 can correspond with areas of the stack that may include sintered surfaces.

FIG. 2B illustrates a plan view of a leadframe 230 with half-etch areas. As shown in FIGS. 2A and 2B, the leadframe 230 (and footprint 202) includes gate protrusions. An example of one such gate protrusion is gate protrusion 231A. Each of the gate protrusions can be configured to be coupled to a gate of a semiconductor die (shown in FIG. 2C). The gate protrusion 231A can be, or can include, a gate contact. The protrusions extend from a common gate conductor CG (also can be referred to as a central gate contact). In this implementation, the common gate conductor CG has a square shape. The leadframe 230 also includes a source portion 232A configured to be coupled to a source of a semiconductor die.

FIG. 2C illustrates a layout of semiconductor die (collectively referred to as semiconductor die 20) to be coupled to the leadframe 230. As shown in FIG. 2C, for example, a semiconductor die 20A is aligned at an angle (e.g., orthogonal) with respect to the semiconductor die 20B, which is adjacent to semiconductor die 20A. The alignment is based on dashed lines R1 and R2 from source S to gate G of each of the respective semiconductor die 20A, 20B. In this implementation, the semiconductor die 20A is aligned orthogonal to semiconductor die 20B. Accordingly, an edge EA of the semiconductor die 20A is non-parallel to an edge EB of the semiconductor die 20B, which is adjacent to semiconductor die 20A. The edge EA of the semiconductor die 20A, however, has edges that are parallel to and/or aligned with semiconductor die 20C. In some implementations (not shown), the edge EA of the semiconductor die 20A can be non-parallel to and non-orthogonal to the edge EB of the semiconductor die 20B. The semiconductor die 20 are aligned along (or disposed within) the same plane.

The gate G of the semiconductor die 20A is configured to be coupled to the gate protrusion 231A of the leadframe 230. The source S of the semiconductor die 20A is configured to be coupled to the source portion 232A of the leadframe 230. In this implementation, the gates G of each of the semiconductor die 20 (e.g., semiconductor die 20A, semiconductor die 20B) are facing toward a center portion C of the semiconductor die 20 so that they can be coupled to the common gate conductor CG.

In this implementation, the semiconductor die 20A is mirrored about the longitudinal axis J1 (e.g., longitudinal axis bisecting) of the common gate conductor CG with semiconductor die 20C. Likewise, the semiconductor die 20B is mirrored about the longitudinal axis J1 of the common gate conductor CG with semiconductor die 20D.

FIG. 2D is a diagram that illustrates portions 250 included in a top surface above the semiconductor die shown in FIG. 2C. In some implementations, the portions 250 shown in FIG. 2D can be drain contacts or spacers. As shown in FIG. 2D, the portions 250 have protrusions or tabs facing away from the center portion.

As shown in FIG. 2E, the gates are coupled to the common gate conductor CG via the gate protrusions (e.g., gate protrusion 231A). A via, or other metal layer, may be coupled to common gate conductor CG so that the semiconductor die 20 can be triggered to switch simultaneously (e.g., substantially simultaneously). The lengths of conductive paths between the gates G of each of the semiconductor die 20 and the common input conductor CG (e.g., a center of the common input conductor CG) can be the same. The lengths of conductive paths between the gates G of each of the semiconductor die 20 and a conductor (e.g., a via, a runner) contacting the common gate conductor CG and through which the semiconductor die 20 can be switched can be the same. The common gate conductor CG is centered between the die gate conductors G of the semiconductor die 20. In some implementations, the die gate conductor G of at least one semiconductor die 20 is oriented with respect to the common gate conductor CG so that a length of a conductive path between the die gate conductor G and the common gate conductor CG is minimized.

FIGS. 3A through 3D are diagrams that illustrate various plan views of components (e.g., layers) of a variation of an inner package. FIG. 3E is a diagram that illustrates a plan view of the components shown in FIGS. 3A through 3D in a composite stack. The labels in FIGS. 3A through 3E are the same as those in FIGS. 2A through 2E because the elements are the same, but the layout (e.g., a pattern) of the components of the inner package are different. Accordingly, some of the features described above in connection with FIGS. 2A through 2E are not repeated in connection with FIGS. 3A through 3E. In the configuration shown in FIGS. 3A through 3E, gate-side edges of the semiconductor die are in a parallel or rectangular layout (can be referred to as a rectangular configuration). The rectangular layout can include a square layout.

FIG. 3A illustrates a plan view of a footprint 202 (in dashed lines) that roughly corresponds with a shape of a leadframe 230 (shown in FIG. 3B).

FIG. 3B illustrates a plan view of a leadframe 230 with half-etch areas. As shown in FIGS. 3A and 3B, the leadframe 230 (and footprint 202) includes gate protrusions (e.g., gate protrusion 231A) and source portions (e.g., source portion 232A). Each of the gate protrusions can be configured to be coupled to a gate of a semiconductor die (shown in FIG. 3C). The protrusions extend from a common gate conductor CG. In this implementation, the common gate conductor CG has a rectangular shape or an elongate shape. In this implementation, the common gate conductor CG can be a runner that is disposed between a pairs of adjacent semiconductor die. In this implementation, the common gate conductor CG can be a runner that separates the package into two halves. The common gate conductor CG in this implementation has a contact area 235 (e.g., protrusions) that are included in a center portion of the semiconductor die.

FIG. 3C illustrates a layout of semiconductor die (collectively referred to as semiconductor die 20) to be coupled to the leadframe 230. As shown in FIG. 3C, for example, a semiconductor die 20A is aligned parallel to the semiconductor die 20B, which is adjacent to semiconductor die 20A. The alignment is based on dashed lines R1 and R2 from source S to gate G of each of the respective semiconductor die 20A, 20B. In this implementation, an edge EA of the semiconductor die 20A is parallel to an edge EB of the semiconductor die 20B, which is adjacent to semiconductor die 20A. The edge EA of the semiconductor die 20A has edges that are parallel to and/or aligned with semiconductor die 20C (on an opposite side of the package). The semiconductor die 20A is mirrored about the longitudinal axis J1 (e.g., longitudinal axis bisecting) the common gate conductor CG with semiconductor die 20C Likewise, the semiconductor die 20B is mirrored about the longitudinal axis J1 of the common gate conductor CG with semiconductor die 20D.

FIG. 3D is a diagram that illustrates portions 250 included in a top surface above the semiconductor die shown in FIG. 3C.

As shown in FIG. 3E, the gates are coupled to the common gate conductor CG via the gate protrusions (e.g., gate protrusion 231A). A via, or other metal layer, may be coupled to the contact area 235 of the common gate conductor CG so that the semiconductor die 20 can be triggered to switch simultaneously (e.g., substantially simultaneously). The lengths of conductive paths between the gates G of each of the semiconductor die 20 and the common input conductor CG (e.g., a center line of the common input conductor CG) can be the same. The lengths of conductive paths between the gates G of each of the semiconductor die 20 and the contact area 235 of the common input conductor CG (e.g., a center of the common input conductor CG) can be the same. In this implementation, the gates G of each of the semiconductor die 20 (e.g., semiconductor die 20A, semiconductor die 20B) are facing toward the common gate conductor CG of the semiconductor die 20 so that they can be coupled to the common gate conductor CG.

FIGS. 4A through 4L are diagrams that illustrate various plan views of components (e.g., layers) of a variation of an inner package. FIGS. 4A through 4L are directed to a four (4) semiconductor die (e.g., MOSFETs) configuration where the semiconductor die 20 are arranged in a U-shape configuration.

Figure 4B:
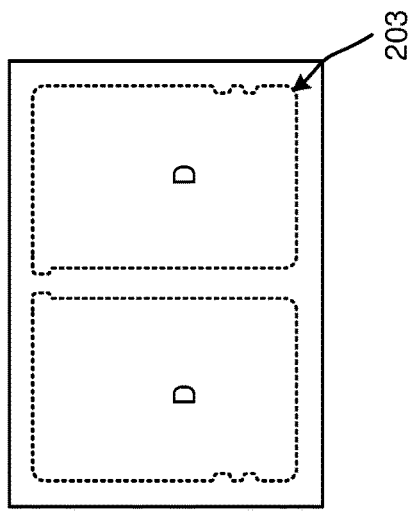
FIGS. 4A through 4L are diagrams that illustrate various plan views of components of a variation of an inner package.
Figure 4A:
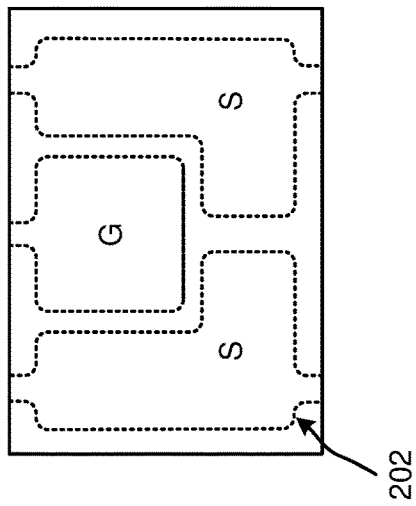
Figure 4D:
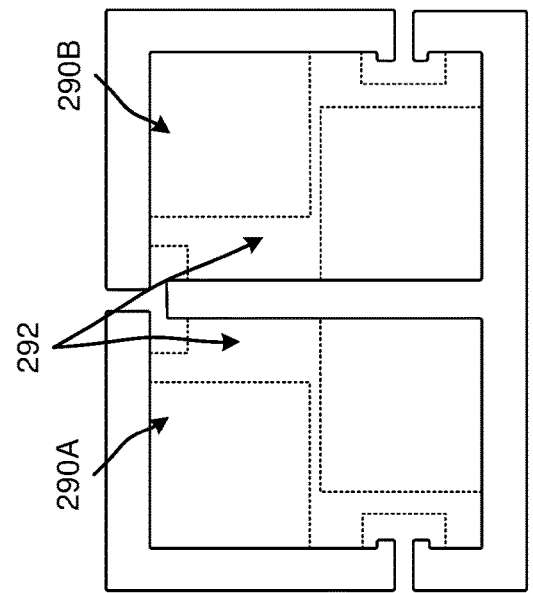

FIG. 4A illustrates a plan view of a footprint 202 (shown in dashed line) of one side (e.g., a gate G and source S side) of a inner package and FIG. 4B illustrates a plan view of a footprint 203 (shown in dashed line) of another side (e.g., a drain side) of the inner package. The footprint 202 shown in FIG. 4A can generally correspond with a leadframe 230 (shown in, for example, FIG. 4F). The source S portions and the gate G portions of the footprint are labeled. A perspective view of the footprint 202, which corresponds with a bottom side of a leadframe 230 is shown in FIG. 4L.

Figure 4C:
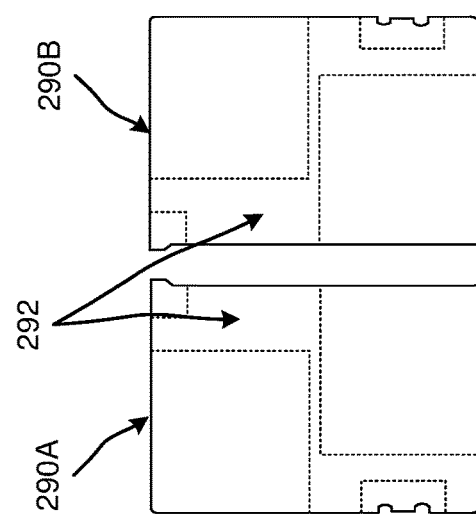

The footprint 203 shown in FIG. 4B can generally corresponds with clips 290A, 290B shown in, for example, FIG. 4C. The footprint 203 corresponds with drain D portions. FIG. 4D illustrates the clips 290A, 290B included in a clip gang (e.g., clip pair) while in a reel. Half-etch portions 292 of the clips 290A, 290B are noted in FIGS. 4C and 4D.

Figure 4E:
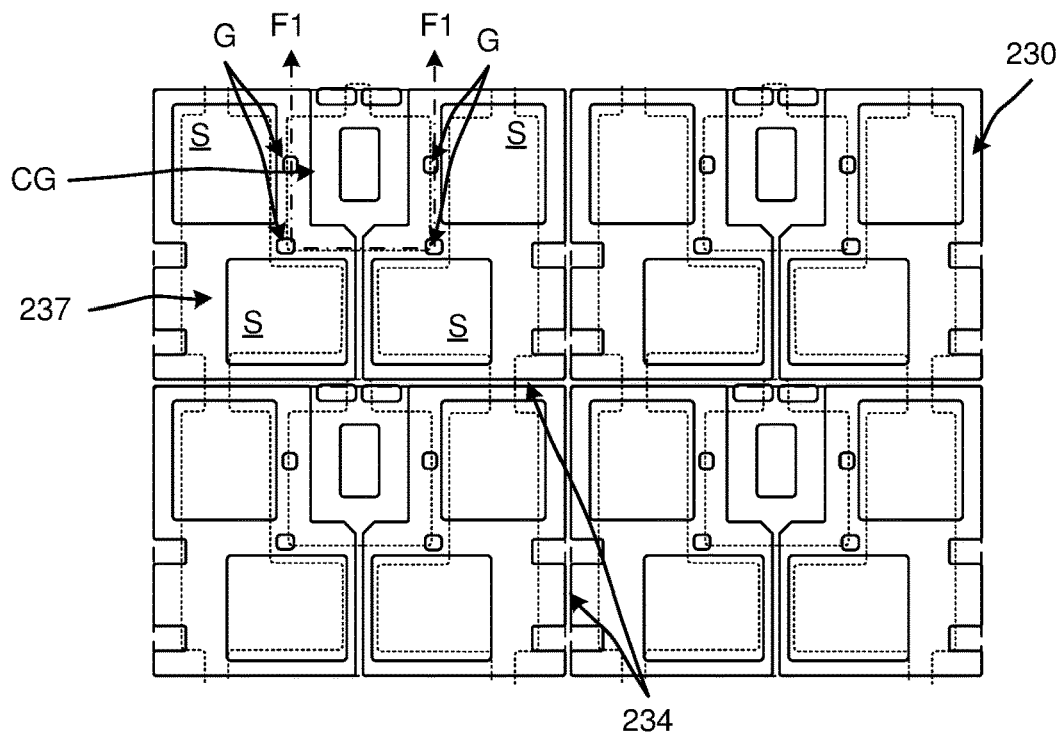

FIGS. 4E through 4I are diagrams in a unit array (e.g., 2×2 unit array) that illustrate various plan views of components (e.g., layers) of the variation of the inner package associated with FIGS. 4A through 4D. FIG. 4E illustrates a leadframe 230 with half-etch areas 237 and inter-unit (e.g., inter-cell) tie bars 234. A perspective view of a top side of the leadframe 230 (a singulated leadframe) with half-etch areas 237 is shown in FIG. 4K. Hidden tie bars 238 (e.g., will be encapsulated within a molding) and exposed tie bars 239 (e.g., will be exposed through a molding) are also shown in FIG. 4K. The hidden tire bars 238 are disposed in a plane that is lower than a plane along which the exposed tie bars 239 are disposed. Half-etched die attach pad (DAP) locks 236 are shown in FIG. 4L.

FIGS. 4E and 4K illustrate a common gate conductor CG. The gate G contacts associated with the common gate conductor CG in this implementation are oriented along a U-shape shown with a combination dashed and dotted line with double arrows labeled as F1. FIGS. 4E and 4K illustrate the locations and orientations of the source S contacts and gate G contacts for the semiconductor die 20 (shown in FIG. 4G as semiconductor die 20A through 20D) with respect to the common gate conductor CG.

Figure 4F:
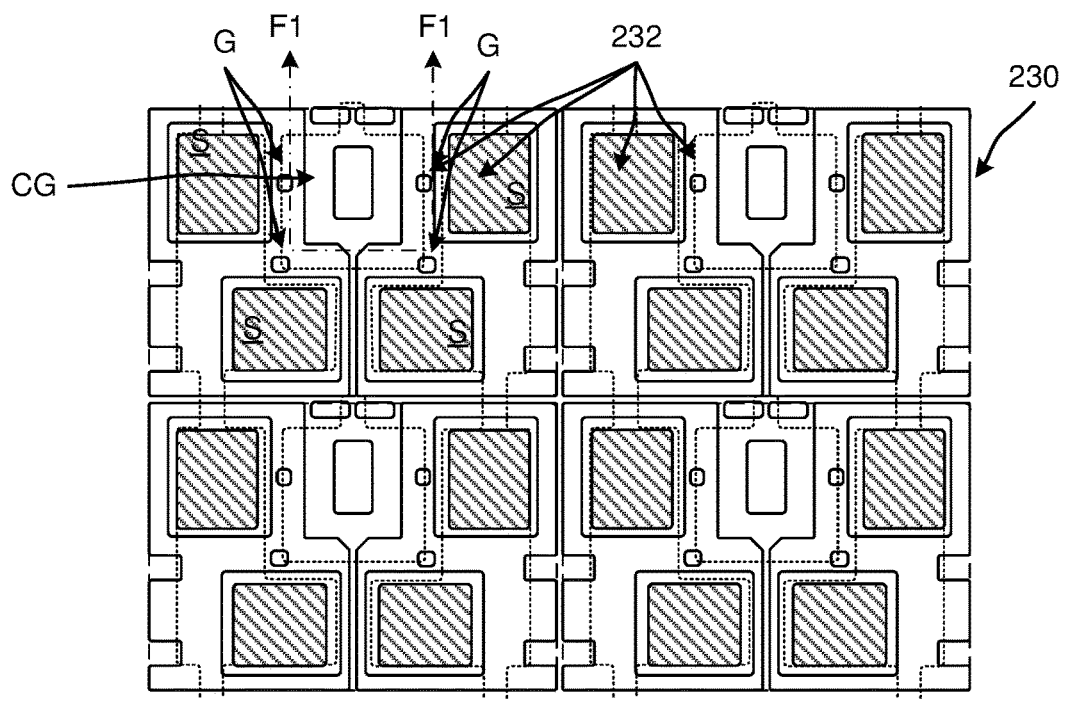

FIG. 4F illustrates a bonding layer 232 (only some portions are labeled) through which the semiconductor die 20 (e.g., the gates G and sources S of the semiconductor die 20) can be coupled to the leadframe 230. The bonding layer 232 can include, for example, a solder, a material that can be sintered, and/or so forth.

Figure 4G:
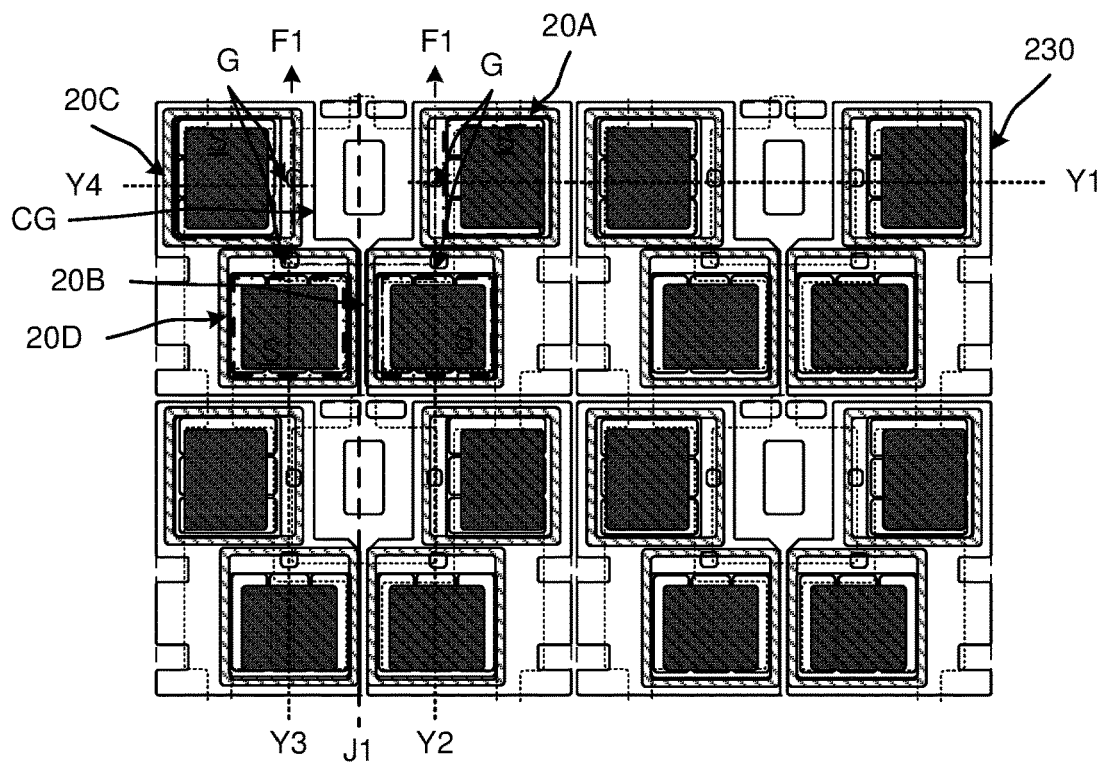

FIG. 4G illustrates the semiconductor die 20 coupled to the leadframe 230 via the bonding layer 232. The semiconductor die 20 are aligned so that the gates G of the semiconductor die 20 are disposed between the sources S of the semiconductor die 20 and the common gate conductor CG.

Because of the shape of the common gate conductor CG, the semiconductor die 20A is aligned so that the gate G and the source S of the semiconductor die 20A are aligned along a line Y1 that is orthogonal to a line Y2 along which the gate G and the source S of the semiconductor die 20B is aligned. The gate G and the source S of the semiconductor die 20A are aligned (along line Y2) parallel to the gate G and the source S of the semiconductor die 20C (which are aligned along line Y3). The semiconductor die 20D is aligned so that the gate G and the source S of the semiconductor die 20D are aligned along a line Y4 that is orthogonal to the line Y3 along which the gate G and the source S of the semiconductor die 20C is aligned.

The semiconductor die 20A is flipped (e.g., mirrored) relative to the semiconductor die 20C (about axis J1). Specifically, the gates G of the semiconductor die 20A, 20C are adjacent to (e.g., proximal to) the common gate conductor CG. The sources S of the semiconductor die 20A, 20C are disposed distal to the common gate conductor CG.

Figure 4H:
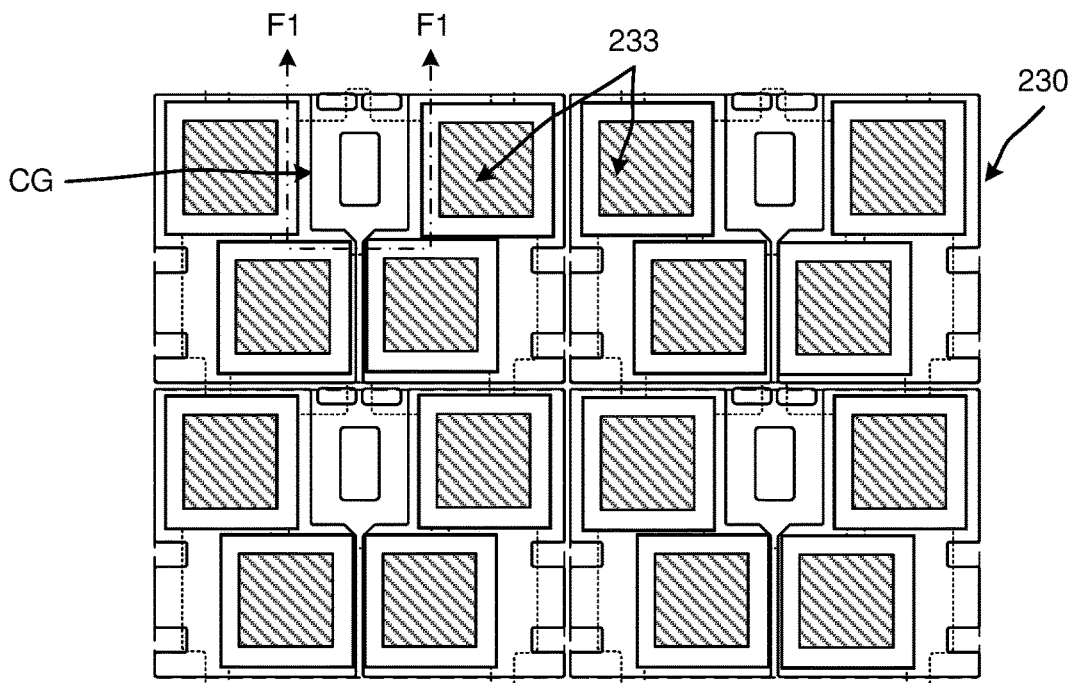
Figure 4I:
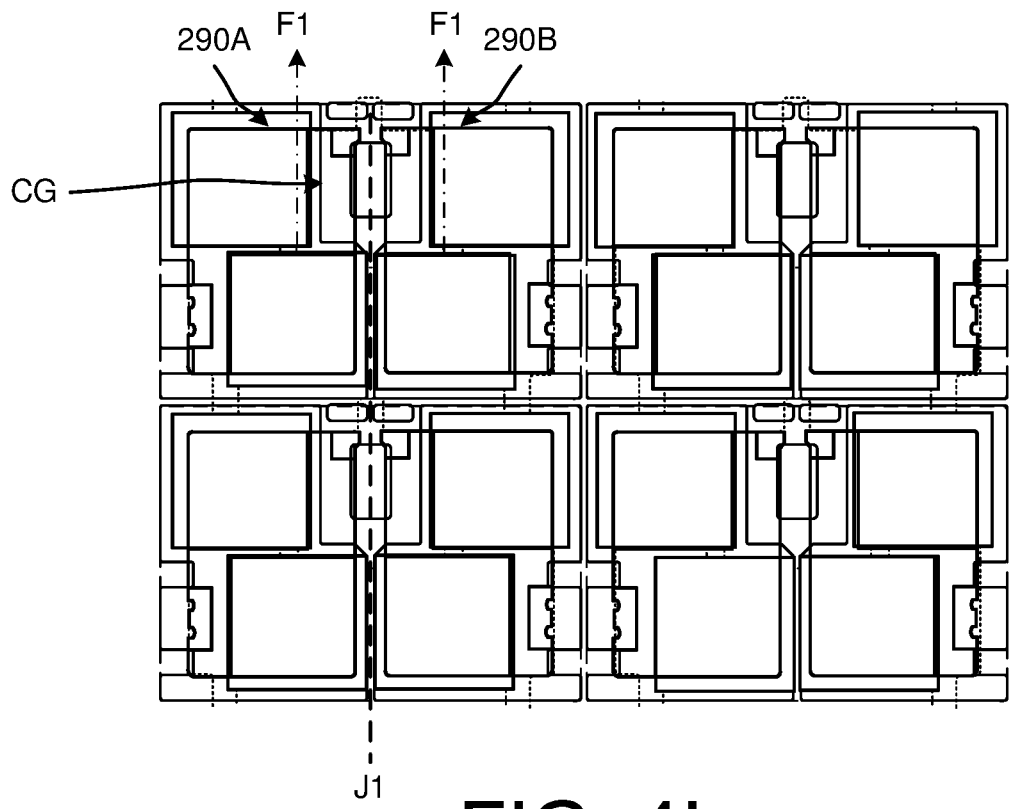

FIG. 4H illustrates a bonding layer 233 (only some portions are labeled) through which the semiconductor die 20 (e.g., the drains D of the semiconductor die 20) can be coupled to clips 290A, 290B (shown in FIG. 4I). The bonding layer 233 can include, for example, a solder, a material that can be sintered, and/or so forth. FIG. 4I illustrates that the clips 290A, 290B are mirrored about the line J1. The clip 290A is coupled to a pair of the semiconductor die 20C, 20D. The clip 290B is coupled to a pair of the semiconductor die 20A, 20B.

Figure 4J:
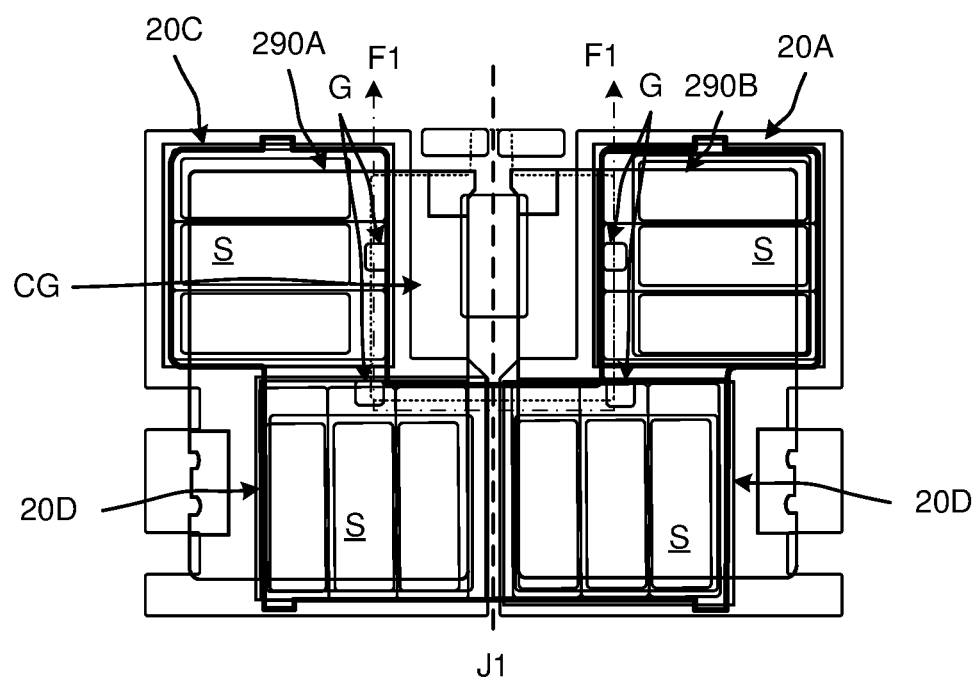
Figure 4K:
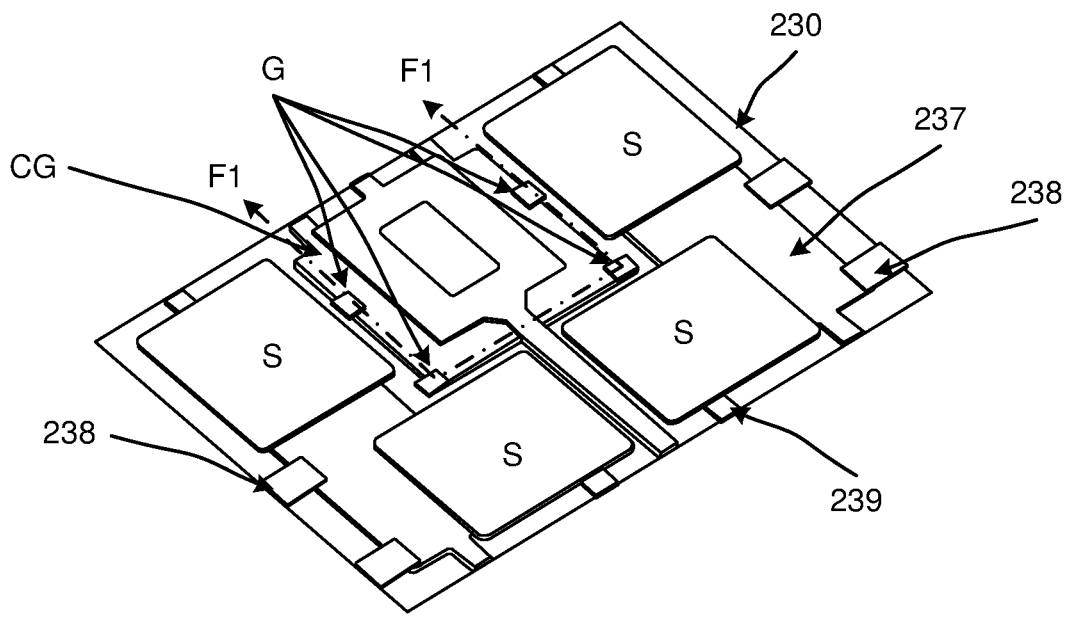
Figure 4L:
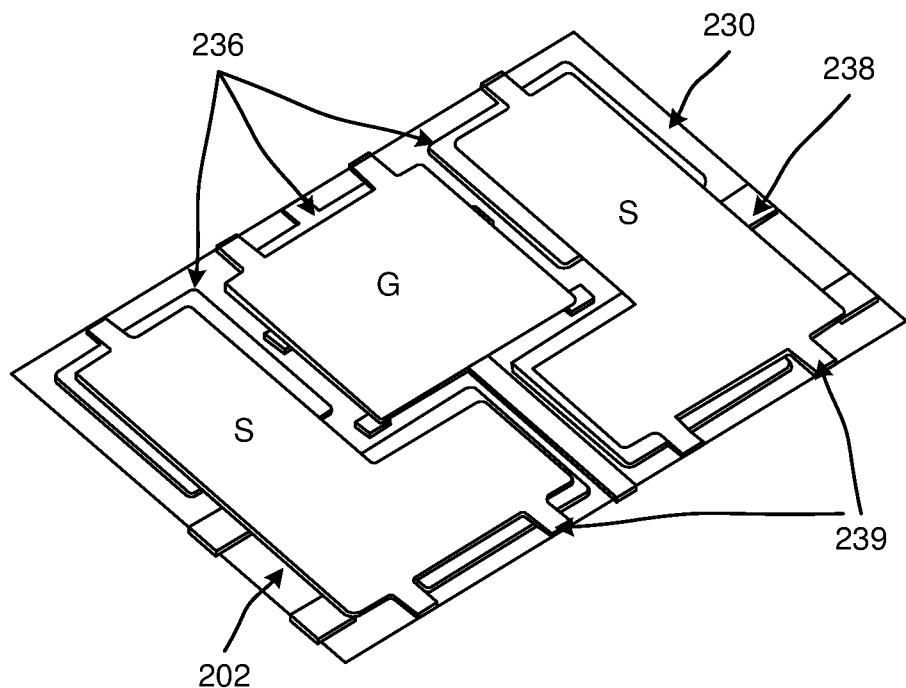

FIG. 4J is a diagram that illustrates the layers of a single semiconductor die corresponding with the layers described in connection with FIGS. 4A through 4I, 4K, and 4L.

Figure 5B:
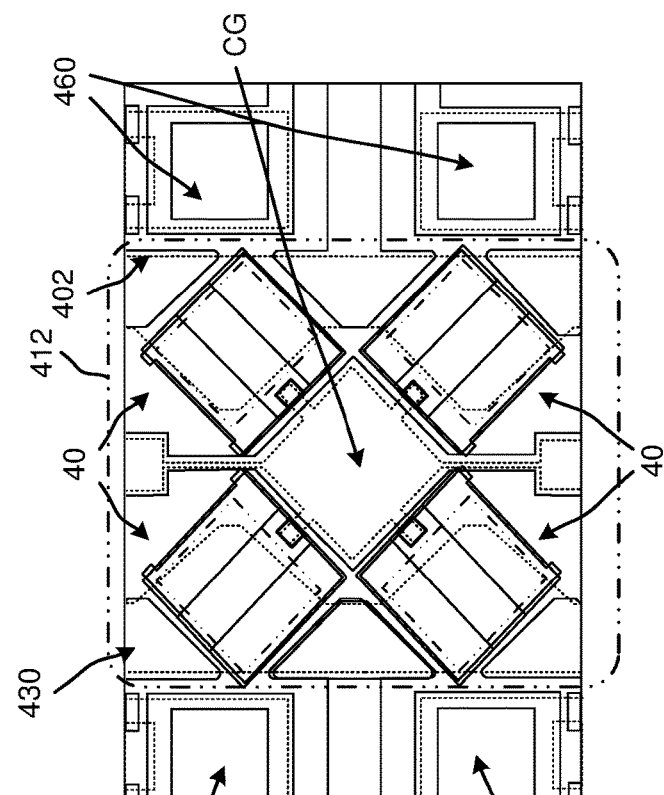
FIG. 5B is a diagram that illustrates a plan view of variation of the components of the inner package shown in FIG. 5A.
Figure 5A:
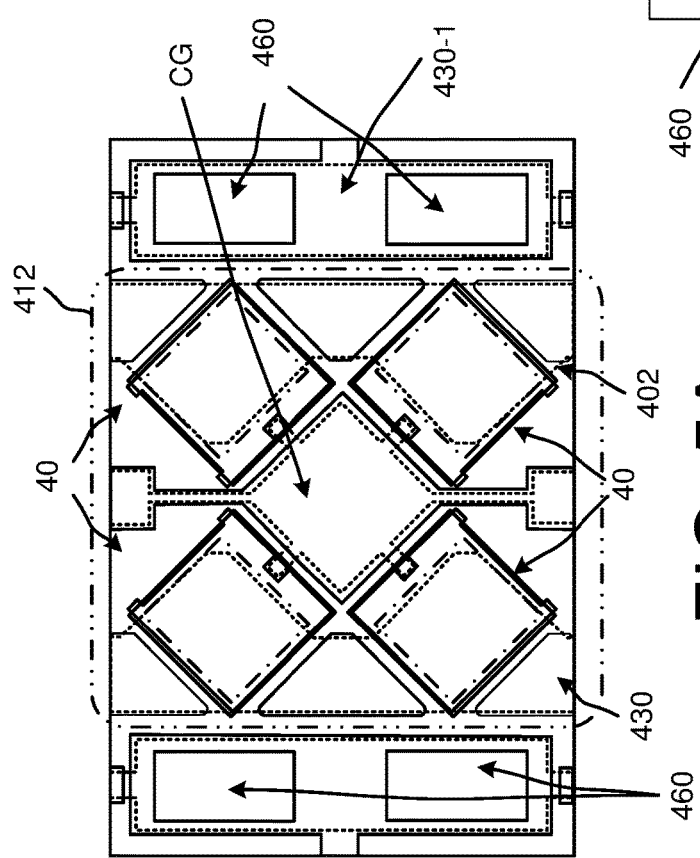
FIG. 5A is a diagram that illustrates a plan view of components of an inner package.

FIG. 5A is a diagram that illustrates a plan view of components (e.g., layers) of an inner package. The layout of an inner portion 412 of the inner package is substantially the same as the diamond-shaped layout of the components shown in, for example, FIG. 2E. The inner package includes semiconductor die 40 coupled to a leadframe 430. The inner package has a footprint 402 (in dashed lines) that roughly corresponds with a shape of the leadframe 430.

In this implementation, diode devices 460 are electrically coupled to the semiconductor die 40. In this implementation, a pair of diode devices 460 are electrically coupled (e.g., electrically coupled via the leadframe portion 430-1) to a pair of the semiconductor die 40 on one side (e.g., right side of a common gate conductor CG) of the inner portion 412. The configuration shown in FIG. 5A includes diode devices 460 disposed outside of (e.g., along a perimeter around) the inner portion 412 of the inner package. The semiconductor die 40 are disposed between the pair of diode devices 460 and the common gate conductor CG. The diode devices 460 and the semiconductor die 40 are disposed within (e.g., aligned along) the same plane.

FIG. 5B is a diagram that illustrates a plan view of variation of the components (e.g., layers) of the inner package shown in FIG. 5A. In this implementation, one of the diode devices 460 is electrically coupled (e.g., electrically coupled via the leadframe portion 430-2) to one of the semiconductor die 40.

FIG. 5C is a diagram that illustrates a plan view of variation of the components (e.g., layers) of the inner package shown in FIG. 5A. This implementation includes a spacer 470 coupled to a portion of the leadframe 430-4. At least a portion of the diodes 460 and at least a portion of the semiconductor die 40 are disposed between the common gate conductor CG and the spacer 470.

FIG. 5D is a diagram that illustrates a plan view of variation of the components (e.g., layers) of the inner package shown in FIG. 5B. This implementation includes the spacer 470 coupled to a portion of the leadframe 430-4 as shown in FIG. 5C.

Figure 5E:
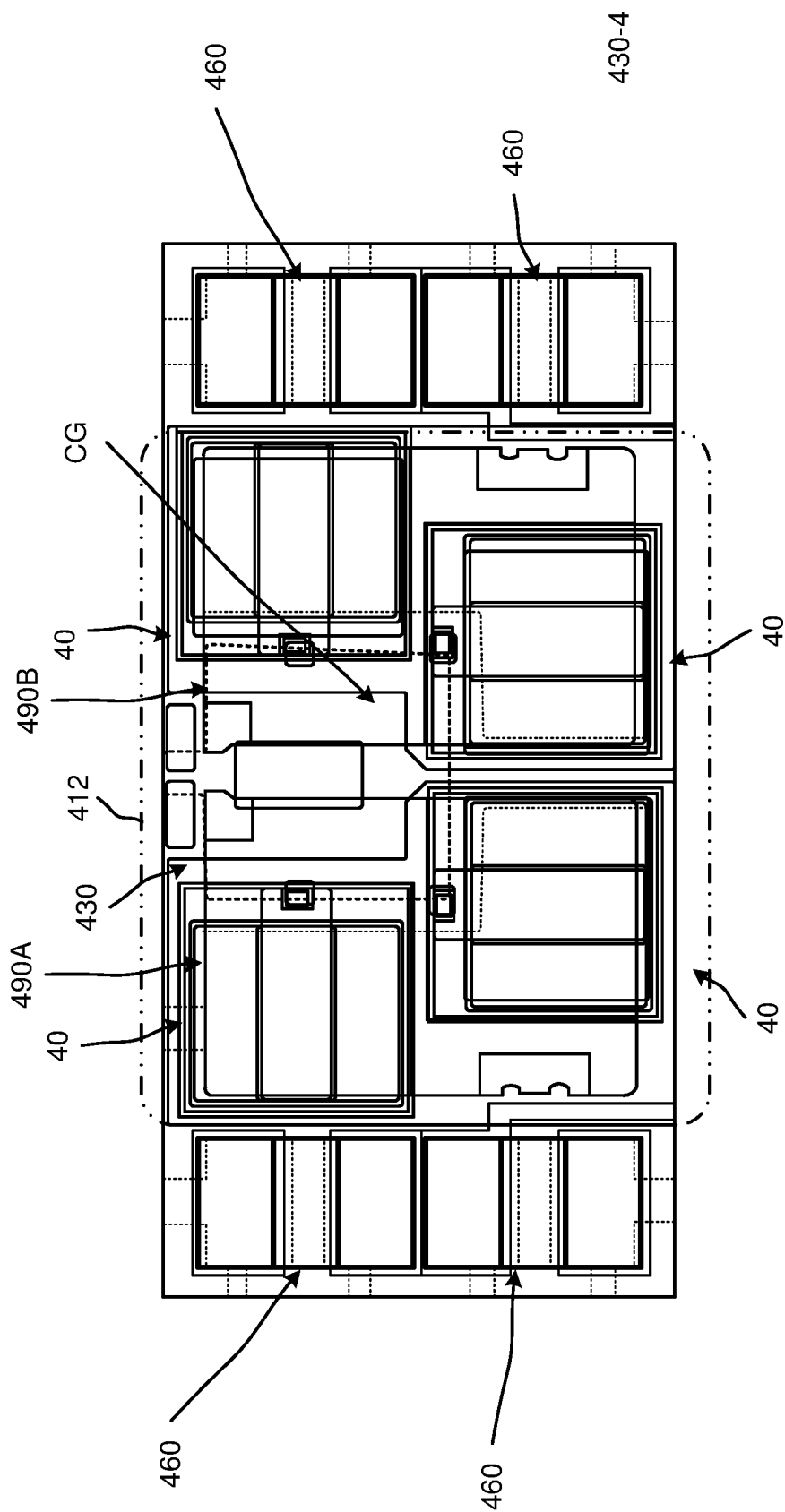
FIG. 5E is a diagram that illustrates a plan view of variation of the components of the inner package shown in FIG. 5B.

FIG. 5E is a diagram that illustrates a plan view of variation of the components (e.g., layers) of the inner package shown in FIG. 5B. In this implementation, two diodes are associated with each semiconductor die 40. This implementation is based on the U-shape configuration. This implementation also includes clips 490A, 490B.

As describe above, the diode devices can be included in the inner packages shown and described in FIGS. 5A through 5D in situations, for example, where body diodes included in transistor devices of the semiconductor die are not sufficient for a particular circuit application. Although shown as diamond configuration in FIGS. 5A through 5D, the semiconductor die can be defined in the rectangular configuration or the U-shaped configuration. In some implementations, the inner packages can include a 1:1 ratio of diode devices and transistor devices. In some implementations, the inner packages can include more or less than a 1:1 (e.g., 1:2, 2:1) ratio of diode devices and transistor devices.

Figure 6:
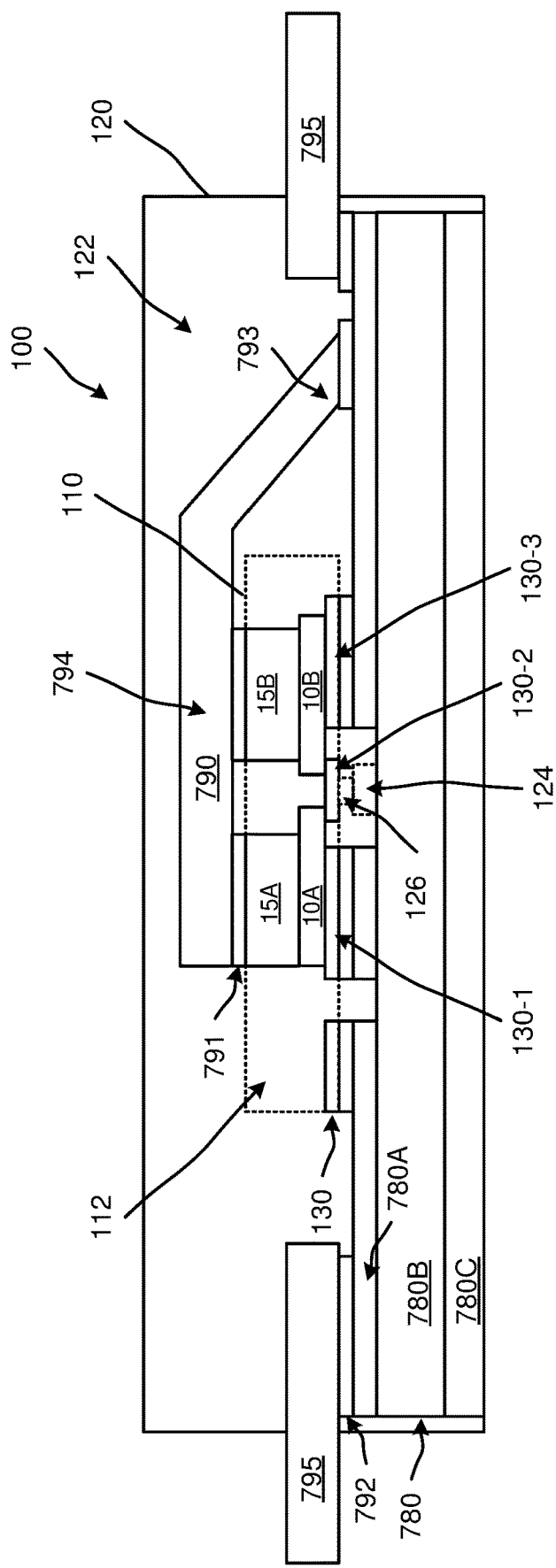
FIGS. 6-8 are diagrams that illustrate side cross-sectional views of components of module including a package disposed within a package.
Figure 7:
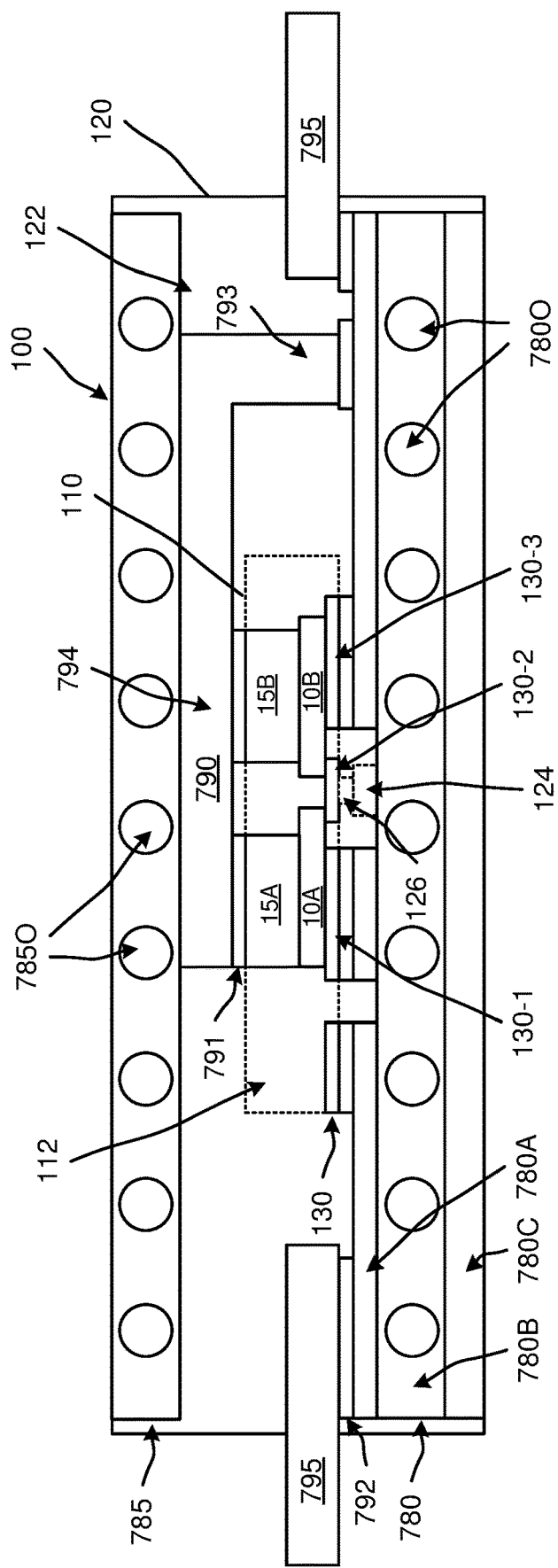
Figure 8:
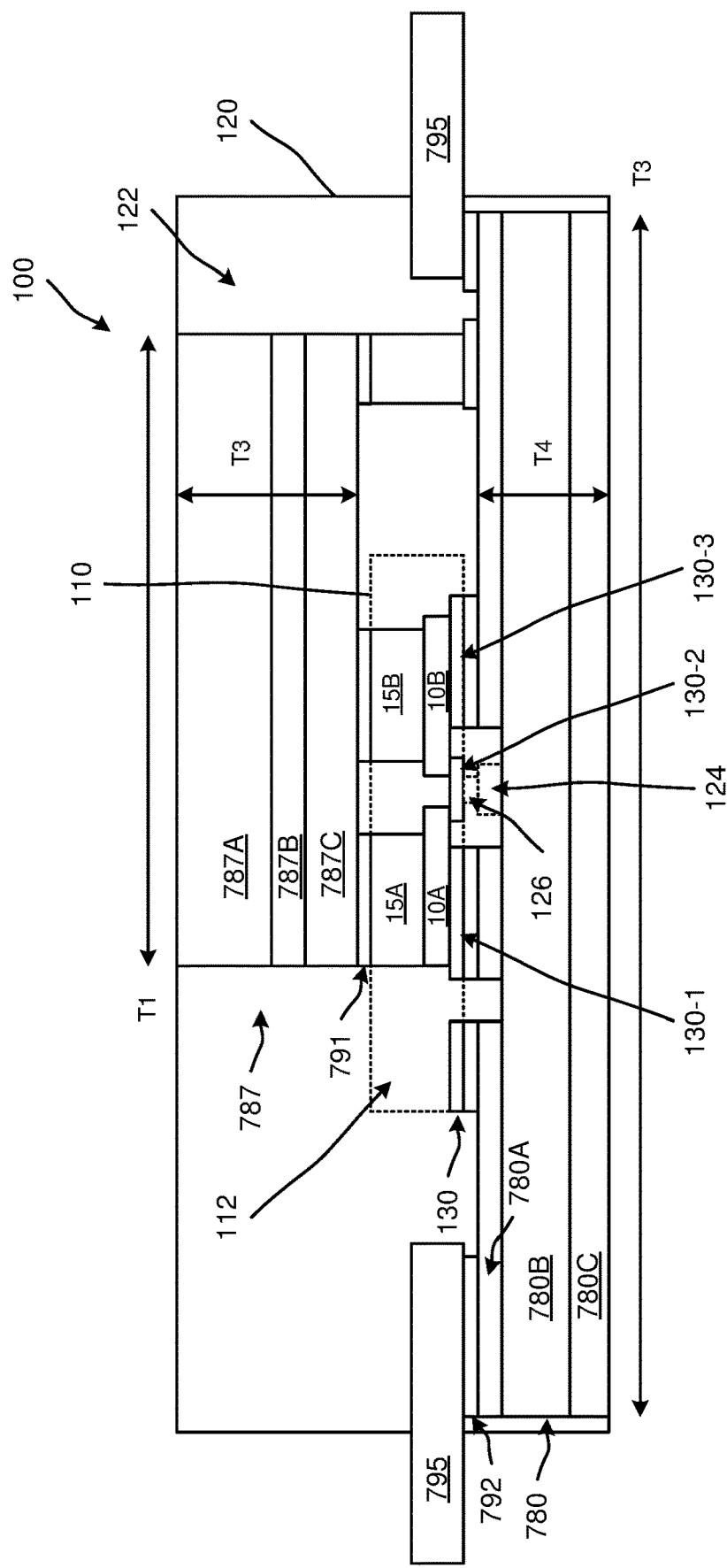

FIGS. 6-8 are diagrams that illustrate side cross-sectional views of components of module 100 including a package 110 (e.g., an inner package, sub-module) disposed within a package 120 (e.g., outer package). Many of the elements are labeled the same as shown in FIG. 1A. FIGS. 6-8 can include any configuration (e.g., rectangular, U-shape, diamond) of semiconductor die.

As shown in FIG. 6, the inner package 110 is coupled to a substrate 780. The substrate 780 is a directed bonded metal substrate (e.g., a directed bonded copper (DBC) substrate). The substrate 780 can include, for example, one or more metal layers and one or more dielectric layers. In some implementations, the substrate 780 can include a dielectric disposed between a first conductor and a second conductor in a direct bonded copper (DBC) substrate. In this implementation, the substrate 780 includes a metal layer 780A, a dielectric 780B and a metal layer 780C. One or more of the metal layers 780A, 780C can be patterned as shown in FIGS. 2A, 3A.

The inner package 110 is coupled to the substrate 780. Specifically, the inner package 110 can be coupled to the metal layer 780A of the substrate 780 via the bonding layer 792. The bonding layer 792 can be, or can include, a sintered layer, a soldered layer, and/or so forth.

As shown in FIG. 6, a top side of the inner package 110 is coupled to the substrate 780 via a clip 790 (e.g., portion 793 of the clip). Specifically, in this implementation, the inner package 110 is coupled to the metal layer 780A of the substrate 780 via the clip 790. The clip 790 (e.g., portion 794 of the clip 790) is coupled to the top side of the inner package 110 via bonding layer 791, which can be, or can include, a sintered layer, a soldered layer, and/or so forth.

As shown in FIG. 6, leads 795 extend outside of (e.g., are exposed outside of) the outer package 120. The leads 795 are electrically coupled to the inner package 110 and/or the clip 790 via the substrate 780 (e.g., the metal layer 780A of the substrate 780).

Although not shown in FIG. 6, an additional substrate can be included in the module 100. Specifically, an additional substrate, which can be the same or different from the substrate 780, can be coupled to a top side (e.g., portion 794) of, for example, the clip 790. Such implementations can be referred to dual-side cooled implementations because the dual substrates can enable top-side and bottom-side cooling. Such an implementation is shown in FIG. 7.

In the diagram shown in FIG. 7, module 100 is a dual-side cooled implementation. Specifically, the substrate 780 (first substrate) is on a bottom side of the module 100 and the substrate 785 is on a top side of the module 100. In this implementation, the substrate 785 does not include metal layers and includes only a dielectric layer. In some implementations, the substrate 785 can include one or more metal layers.

In this implementation, the dielectric 780B of the substrate 780 includes openings 7800 through which a fluid can be moved to facilitate cooling. The substrate 785 also includes such openings 7850. In some implementations, openings may be included in only one of the substrates (e.g., substrate 785 or substrate 780). In some implementations, openings may be excluded from both of the substrates 780, 785.

In the implementation shown in FIG. 7, the clip 790 has a different shape than the slip 790 shown in FIG. 6. Specifically, the clip 790 shown in FIG. 7 has a shape that increases (e.g., maximizes) contact with the substrate 785. Specifically, the clip 790 has a first portion (e.g., portion 794 (top portion)) that extends along the bottom surface of the substrate 785, and a second portion (e.g., portion 793 (vertical portion)) extends from the clip down (and orthogonally aligned to the first portion) to the substrate 780.

Although not shown in FIG. 6 or 7, the clip 790 can be included in the inner package 110 in some implementations. In such implementations, the bottom surface of portion 794 of the clip 790 can be coupled to the top surfaces of the semiconductor die 15A, 15B using, for example, the bonding layer 791. Also, in such implementations, a portion (e.g., a bottom surface of portion 793) of the clip 790 can be exposed through the bottom surface of the inner package 110 so that the clip 790 can be coupled to, for example, the substrate 780. In implementations where the clip 790 is included in the inner package 110, one or more of the spacers 15A, 15B can be excluded. In some implementations where the clip 790 is included in the inner package 110, one or more of the spacers 15A, 15B can be disposed within the inner package 110 and coupled to a top side of portion 794 of the clip 790.

FIG. 8 illustrates a variation of the module 100 that is a dual-side cooled implementation. As shown in FIG. 8, the module 100 includes a substrate 787 (e.g., a T-clad) coupled to a top side of the inner package 110 via bonding layer 791. The substrate 787 can include, for example, one or more metal layers and one or more dielectric layers. In some implementations, the substrate 787 can include a dielectric disposed between a first conductor and a second conductor in a direct bonded copper (DBC) substrate. In this implementation, the substrate 780 includes a metal layer 787A, a dielectric 787B and a metal layer 787C. One or more of the metal layers 787A, 787C can be patterned. The substrate 787 has a longer length T1 than a length T3 of the substrate 780. The substrate 787 has a greater thickness T2 than a thickness T4 of the substrate 780.

In some implementations, one or more of the metal layers in one or more of the substrates described herein (e.g., in FIGS. 6-8) can have a different thickness than one or more of the other metal layers (within the same substrate or a different substrate). In some implementations, one or more dielectric layers in one or more of the substrates described herein (e.g., in FIGS. 6-8) can have a different thickness than one or more of the other dielectric layers (within the same substrate or a different substrate).

FIGS. 9A through 9D illustrates a method of manufacturing at least a portion of the inner packages (e.g., inner package 110) described herein. As shown in FIG. 9A, a conductive metal layer 930 (e.g., on a substrate, stamped as a leadframe) can be defined (e.g., formed). The conductive metal layer 930 can include a common gate conductor CG.

Semiconductor die 30 can be electrically coupled to the conductive metal layer 930. In some implementations, the semiconductor die 30 can be coupled in a flip chip configuration (with source and gate down (e.g., coupled to the conductive metal layer 930)). The gates of the semiconductor die 30 can be coupled to the common gate conductor CG, and the sources of the semiconductor die 30 can be coupled to other portions of the conductive metal layer 930. The conductive metal layer 930 and the semiconductor die 30 can be configured so that the distance (e.g., conductive path) from a terminal (e.g., common terminal) used to switch the semiconductor die 30 via the conductive metal layer 930 can be the same.

As shown in FIG. 9C, a conductive metal layer 940 (e.g., a thick copper layer lead, a sintered layer, a spacer, a T-clad) (illustrated with a dashed line and as a transparent layer) can be coupled to the drains of the semiconductor die 30 (e.g., on a top side of the semiconductor die). Substrates are not illustrated in this implementation.

As shown in FIG. 9D, a molding 912 (illustrated with dotted and dashed line, and as a transparent layer) can be used to encapsulate the components (e.g., semiconductor die 30, conductive metal layer 930, conductive metal layer 940). In some implementations at least some portions of the common gate conductor CG and/or conductive metal layer 940 can be exposed (e.g., exposed via grinding) through the molding 912.

FIGS. 10A through 10D illustrates a variation of the method of manufacturing shown in FIGS. 9A through 9D. In this variation, a conductive metal layer configured as spacers 950 (e.g., conductive spacers) are coupled to the drains (e.g., top portions) of the semiconductor die 30. In some implementations at least some portions of the common gate conductor CG and/or spacers 950 can be exposed (e.g., exposed via grinding) through the molding 912.

The manufacturing methods shown in FIGS. 9A through 10D are implemented using a rectangular configuration (shown in, for example, FIGS. 3A through 3E), however, a diamond configuration (shown in, for example, FIG. 2A through 2E and 5A through 5D) or a U-shape configuration (shown in, for example, FIGS. 4A through 4L and 5E) can be implemented as well.

Figure 11:
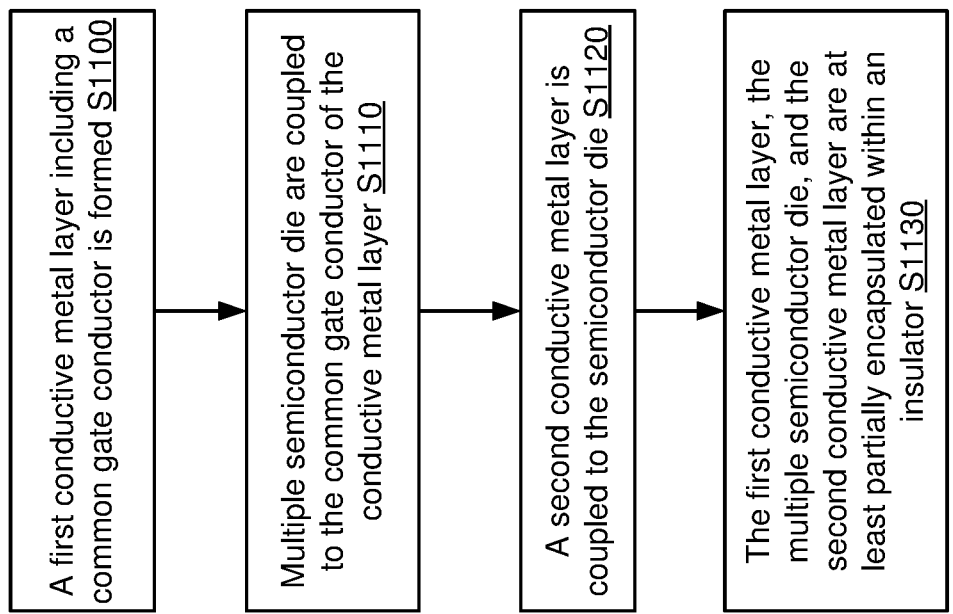
FIG. 11 illustrates a method of manufacturing an inner package included within a module.

FIG. 11 illustrates a method of manufacturing an inner package included within a module. As shown in FIG. 11, a first conductive metal layer including a common gate conductor is formed (block S1100). In some implementations, the first conductive metal layer can be included within a substrate (e.g., can be included in a patterned metal layer of the substrate). In some implementations, the first conductive metal layer can be a leadframe.

Multiple semiconductor die are coupled to the common gate conductor of the first conductive metal layer (block S1110). The multiple semiconductor die can include silicon carbide die. The multiple semiconductor die can include IGBTs. In some implementations, the multiple semiconductor die can be in a diamond configuration or layout with respect to the common gate conductor of the conductive metal layer. In some implementations, the multiple semiconductor die can be in a U-shape configuration or layout with respect to the common gate conductor of the conductive metal layer. In some implementations, the multiple semiconductor die can be in a rectangular configuration or layout with respect to the common gate conductor of the conductive metal layer. In some implementations, the gates of the multiple semiconductor die can be coupled to the common gate conductor with the same conductive path lengths as described herein.

A second conductive metal layer is coupled to the multiple semiconductor die (block S1120). In some implementations, the second conductive metal layer can be a spacer.

The first conductive metal layer, the semiconductor die, and the second conductive metal layer are at least partially encapsulated within an insulator (block S1130). In some implementations, the insulator can include a molding, an epoxy, a potting, and/or so forth. In some implementations, at least a portion of the second conductive metal layer can be exposed through the molding. In some implementations, at least a portion of the second conductive metal layer can be coupled to a substrate and/or a clip. In some implementations, a conductor can be exposed through the molding and in contact with the common gate conductor so that the multiple semiconductor die can be switched via the common gate conductor.

In some implementations, at least one or more of the components included within the module including the inner package are coupled via a sintered material. In some implementations, one or more diodes can be included within the inner package of the module.

Figure 12:
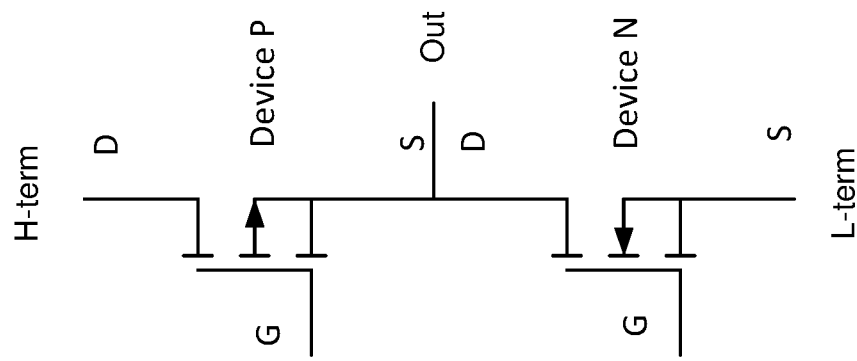
FIG. 12 is a diagram that illustrates a circuit configuration that can be implemented using the modules described herein.

FIG. 12 is a diagram that illustrates a circuit 1200 configuration that can be implemented using the modules (and packages) described herein. As shown in FIG. 12, the circuit includes a high-side device (e.g., P-type Device (Device P)) and a low-side device (e.g., an N-type Device (Device N)). The source S, drain D, and gate G of each of the devices is labeled in FIG. 12. The high-side terminal (H-term), the low-side terminal (L-term), and the output terminal Out are shown in FIG. 12. The circuit 1200 is in an inverter configuration without the output Out. Each of the devices (e.g., Device P, Device N) can be defined within an inner package.

The circuit 1200 shown in FIG. 12 can be implemented, for example, in the modules shown in FIGS. 13A through 19D. The terminals (e.g., leads) of the circuit 1200 are labeled in many of these configurations. The side of the device associated with the low-side terminal can be referred to as a low side of the device, and the side of the device associated with the high-side terminal can be referred to as a high side of the device.

FIGS. 13A through 13D are diagrams that illustrate various views of a module 1300. As shown in the plan view FIG. 13A, a P-type device includes multiple semiconductor die 30P coupled to a substrate 1380 using clips 1390P (e.g., one clip per pair of semiconductor die), and an N-type device includes multiple semiconductor die 30N coupled to a substrate 1380 using clips 1390N (e.g., one clip per pair of semiconductor die). In this implementation, the drains of the semiconductor die 30P, 30N are coupled to the substrate via the clips 1390P, 1390N. The side view FIG. 13B is viewed along direction N1 of FIG. 13A, and the side view FIG. 13C is viewed along direction P1 of FIG. 13A. FIG. 13D is viewed along direction B1. The semiconductor die 30P (gates of the semiconductor die 30P) are switched via wirebonds coupled to a common gate conductor CG-P. The semiconductor die 30N (gates of the semiconductor die 30N) are switched via wirebonds coupled to a common gate conductor CG-N.

FIGS. 14A and 14B are diagrams that illustrate various views of a variation of the module 1300. In this implementation, the clips 1390P and 1390N are replaced with wirebonds.

FIGS. 15A through 17E are diagrams that illustrate various view of modules including an inner package (e.g., inner package 110, the inner package shown in any of, for example, FIGS. 2A through 5D) disposed within an outer package (e.g., outer package 120, the outer package shown in any of, for example, FIGS. 6 through 8). The modules disclosed in these embodiments exclude wirebonds. In other words, the modules are wireless modules. A sintered material, solder, and/or so forth (which can be included in a bonding layer) can be used to couple any pair of the components (e.g., clip, semiconductor die, spacer, inner package, substrate, etc.). Although FIGS. 15A through 17E are illustrated with semiconductor die in a diamond configuration, the rectangular or U-shape configuration can be implemented as well.

Figures 15A, 15B, 15C:
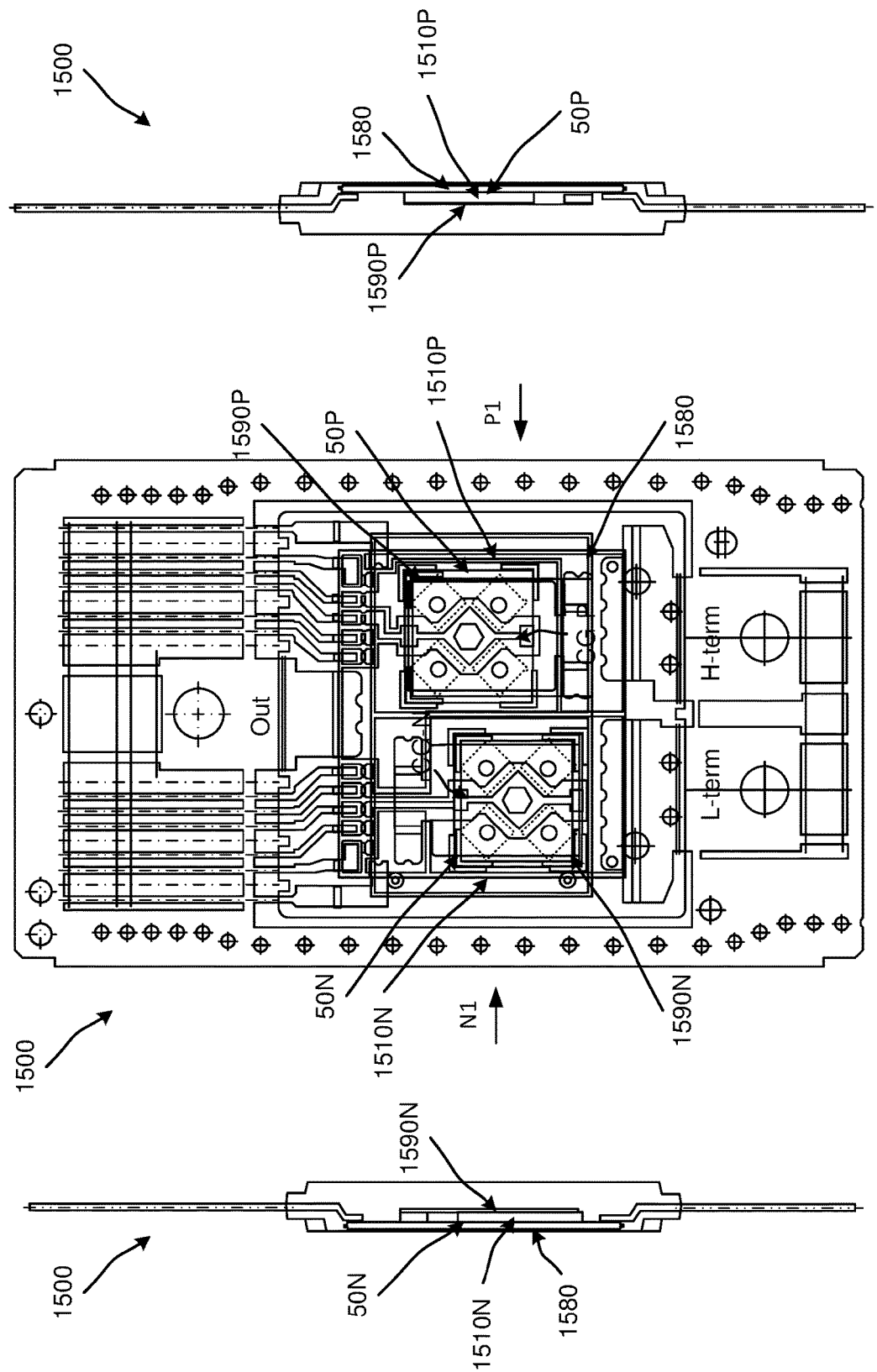

FIGS. 15A through 15C are diagrams that illustrate various views of a module 1500. As shown in the plan view FIG. 15A, an inner package 1510P of a P-type device includes multiple semiconductor die 50P coupled to a substrate 1580 using a clip 1590P (e.g., one clip per the multiple semiconductor die), and an inner package 1510N of an N-type device includes multiple semiconductor die 50N coupled to a substrate 1580 using a clip 1590N (e.g., one clip per the multiple semiconductor die). In this implementation, the drains of the semiconductor die 50P, 50N are coupled, respectively, to the substrate via the clips 1590P, 1590N. The side view FIG. 15B is viewed along direction N1 of FIG. 15A, and the side view FIG. 15C is viewed along direction P1 of FIG. 15A.

In this implementation, the multiple semiconductor die 50P are included in the inner package 1510P where the semiconductor die 50P are in a diamond configuration. The semiconductor die 50P (gates of the semiconductor die 50P) are switched via a common gate conductor CG-P.

The multiple semiconductor die 50N are also included in the inner package 1510N where the semiconductor die 50N are in a diamond configuration. The semiconductor die 50N (gates of the semiconductor die 50N) are switched via a common gate conductor CG-N.

FIG. 15D is a diagram that illustrates a metal layer pattern 1580A of the substrate 1580A. FIG. 15E is a diagram that illustrates a layout of the inner packages 1510P, 1510N on the metal layer pattern 1580A of the substrate 1580A.

FIGS. 15F and 15G are diagrams that illustrate side and plan views, respectively, of the clip 1590P (coupled to the inner package 1510P). Although not shown, the clip 1590N (coupled to inner package 1510N) can have the same shape as the clip 1590P. The clip 1590P include a portion 1593P that corresponds approximately with a thickness of the semiconductor die 50P.

As shown in FIG. 15A, the inner package 1510N is offset (e.g., shifted) within a plane relative to the inner package 1510P. Also, the clip 1590P is oriented in a direction that is flipped relative to the clip 1590N.

In this implementation, a single substrate 1580 is coupled to both inner packages 1510N, 1510P. Although not shown, in some implementations, separate substrates can be coupled to each of the inner packages.

FIGS. 16A through 16D are diagrams that illustrate various views of a variation of the module 1500 shown in FIGS. 15A through 15G. The module 1500 shown in these figures can be a dual-side cooling implementation that also includes the clips 1590N, 1590P. Elements described in connection with FIGS. 15A through 15G are not repeated in connection with this variation.

Figures 16A, 16B, 16C:
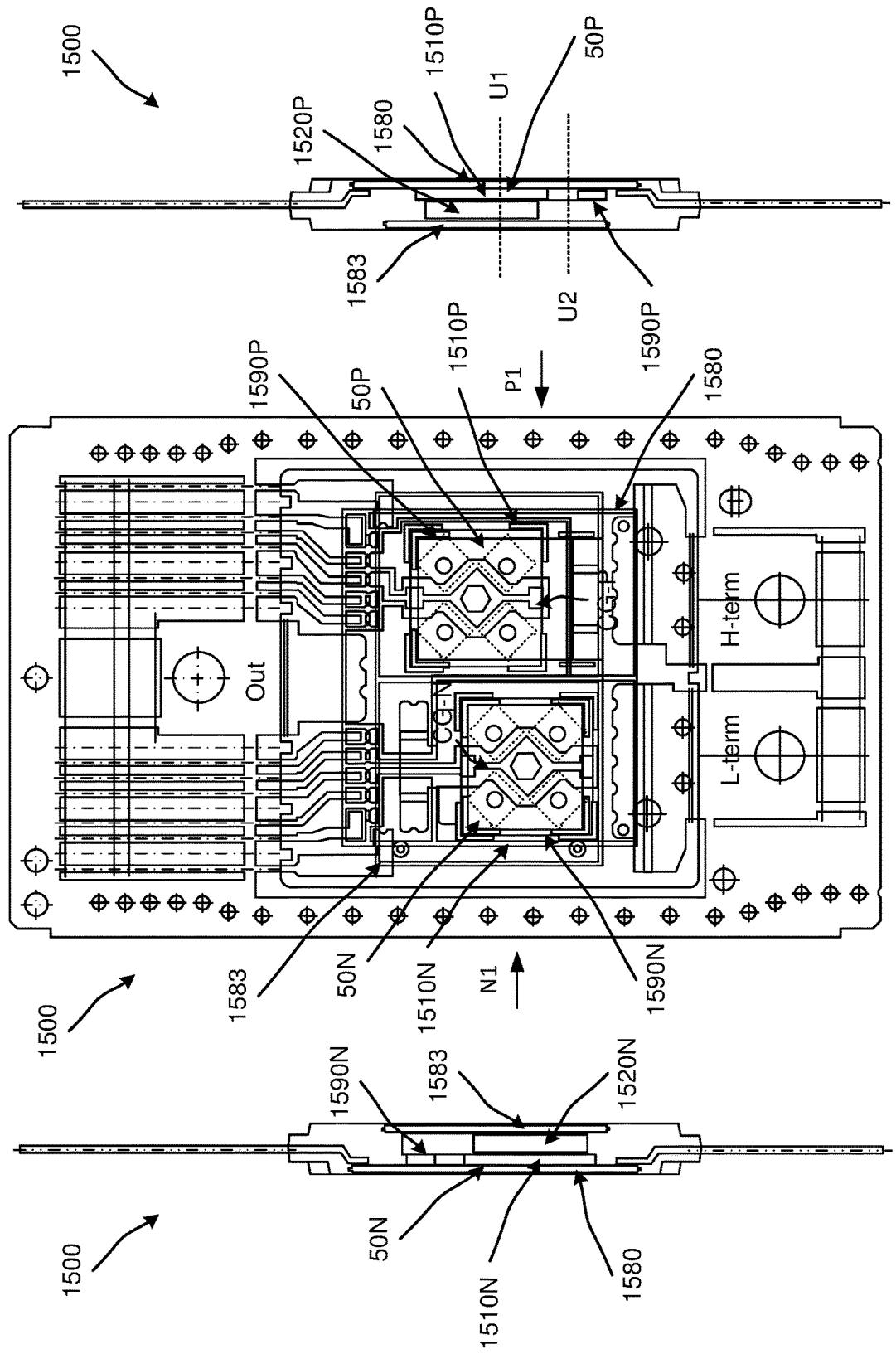

As shown in FIGS. 16A through 16C, a substrate 1583 is disposed on a side (e.g., top side) of the module 1500 opposite the substrate 1580 (on the bottom side). The substrate 1583 can be referred to as a top substrate and the substrate 1580 can be referred to as a bottom substrate. As shown in FIG. 16C, for example, a spacer 1520P is disposed between the substrate 1583 and the clip 1590P. Accordingly, a vertical stack (from top to bottom along the dashed line U1) can include the substrate 1583, the spacer 1520P, the clip 1590P, the inner package 1510P, and the substrate 1580. A vertical stack (from top to bottom along the dashed line U2) can include the substrate 1583, the clip 1590P, and the substrate 1580. The low side of the device is similarly configured.

FIG. 16D illustrates a patterned surface of a metal layer 1583A of the substrate 1583 in contact with the spacers 1520N, 1520P coupled respectively to the inner packages 1510N, 1510P. Markings to align the metal layer 1583A with the contact locations of the inner packages 1510N, 1510P and spacers 1520N, 1520P are illustrated by the angled corners (4 markings per inner package). In this implementation, a single substrate 1583 is coupled to the top side of both inner packages 1510N, 1510P. Although not shown, in some implementations, separate substrates can be coupled to each of the inner packages in lieu of the single substrate 1583.

FIGS. 17A through 17E are diagrams that illustrate various views of a variation of the module 1500 shown in FIGS. 15A through 16D. The module 1500 shown in these figures can be a dual-side cooling implementation that excludes the clips 1590N, 1590P. Elements described in connection with FIGS. 15A through 16D are not repeated in connection with this variation.

As shown in FIG. 17C, for example, the spacer 1520P is disposed between the substrate 1583 and the inner package 1510P. Also, a spacer 1522P is disposed between the spacer 1520P and the substrate 1580. Accordingly, a vertical stack (from top to bottom along the dashed line S1) can include the substrate 1583, the spacer 1520P, the inner package 1510P, and the substrate 1580. A vertical stack (from top to bottom along the dashed line S2) can include the substrate 1583, the spacer 1520P, the spacer 1521P, and the substrate 1580. The spacer 1520P can be referred to as a top spacer and the spacer 1521P can be referred to as a bottom spacer. The low side of the device is similarly configured.

Figure 17E:
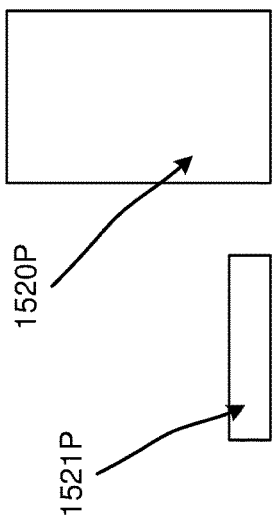
Figure 17D:
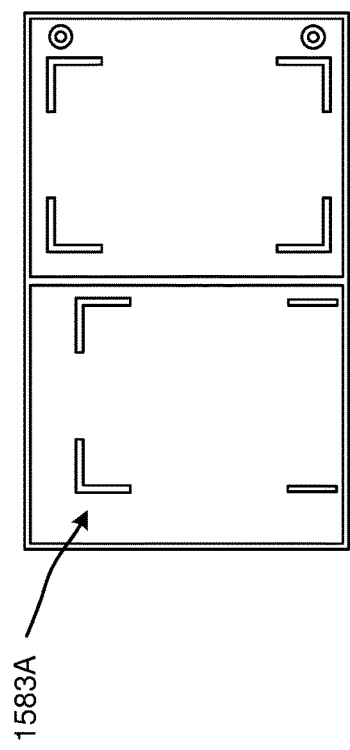

FIG. 17D illustrates a patterned surface of a metal layer 1583A of the substrate 1583 in contact with the spacers 1520N, 1520P (which are larger in surface area than the spacers shown in FIGS. 16A through 16D) coupled respectively to the inner packages 1510N, 1510P. Markings to align the metal layer 1583A with the contact locations of the inner packages 1510N, 1510P and spacers 1520N, 1520P are illustrated by the angled corners (4 markings per inner package). The plan views of the spacers 1520P and 1521P are shown in FIG. 17E.

In this implementation, a single substrate 1583 is coupled to the top side of both inner packages 1510N, 1510P. Although not shown, in some implementations, separate substrates can be coupled to each of the inner packages in lieu of the single substrate 1583.

Figure 18B:
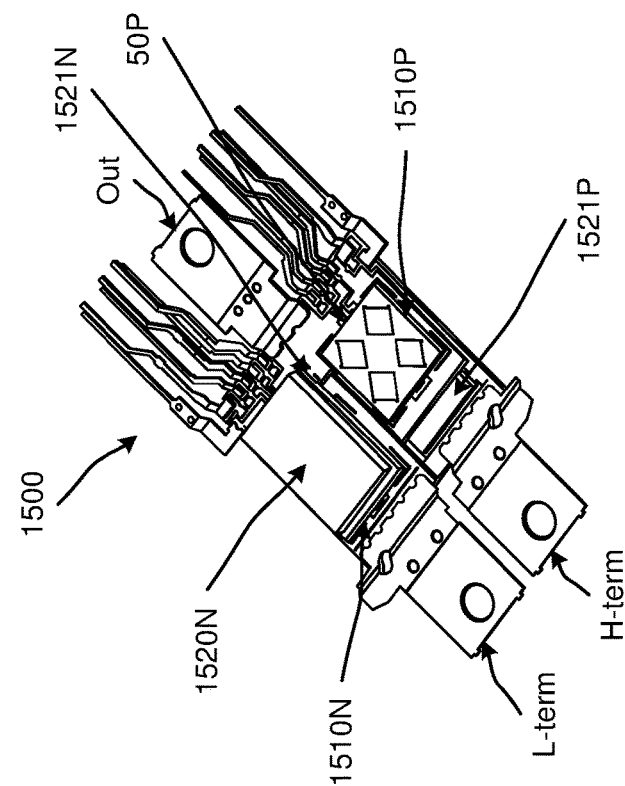
FIGS. 18A and 18B are diagrams that illustrate solid perspective views of the module described in connection with at least FIGS. 17A through 17E.
Figure 18A:
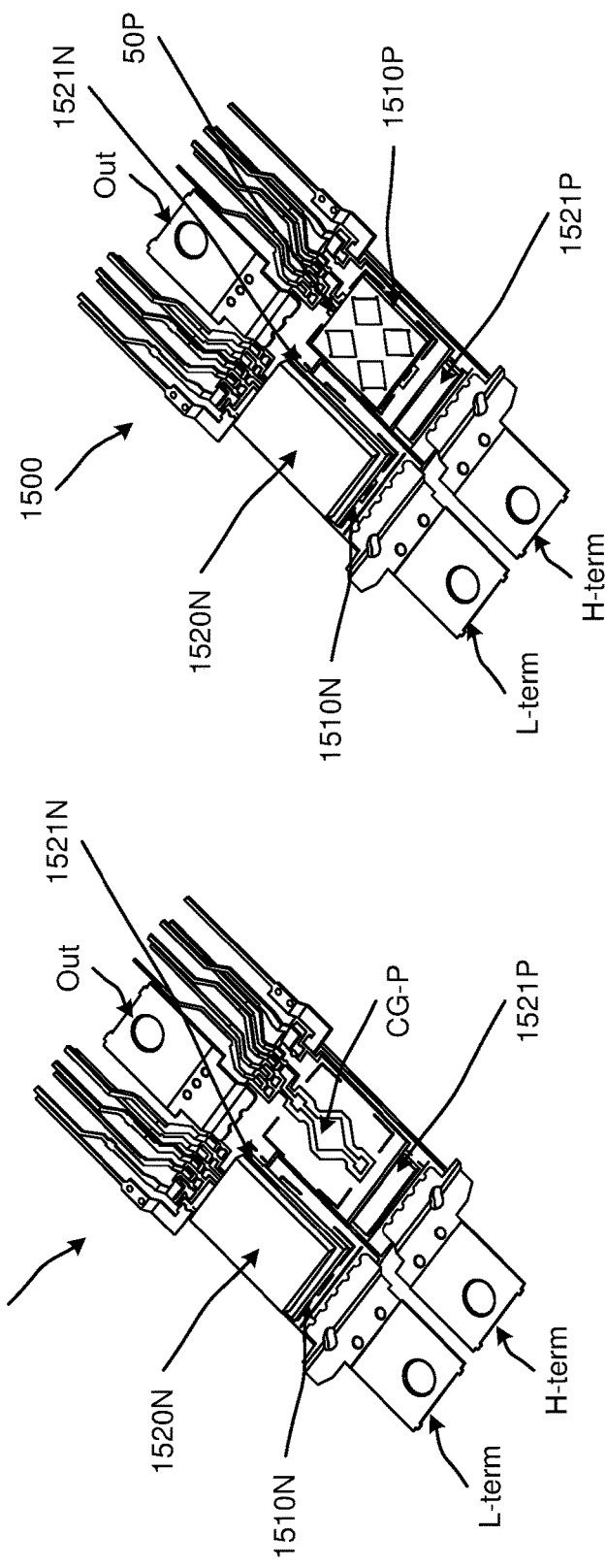

FIGS. 18A and 18B are diagrams that illustrate solid perspective views of the module 1500 described in connection with at least FIGS. 17A through 17E.

Figure 19B:
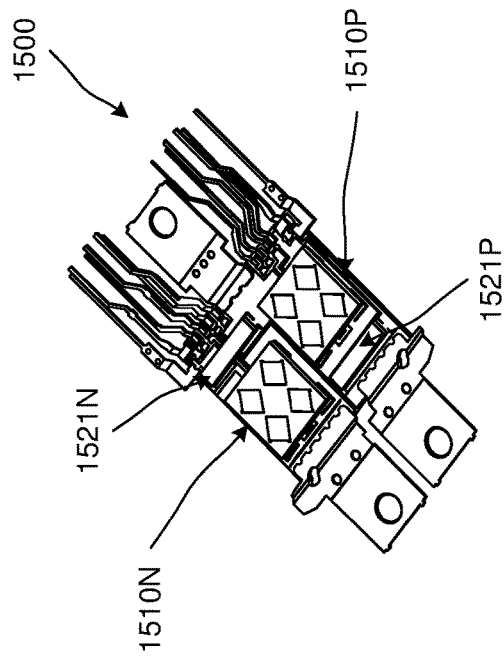
FIGS. 19A through 19D are diagrams that illustrate a method of manufacturing the devices described herein.
Figure 19D:
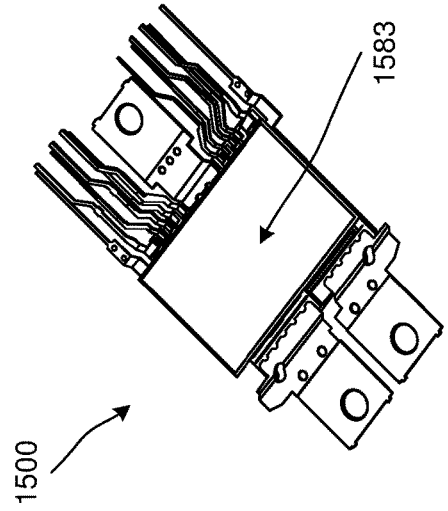
Figure 19A:
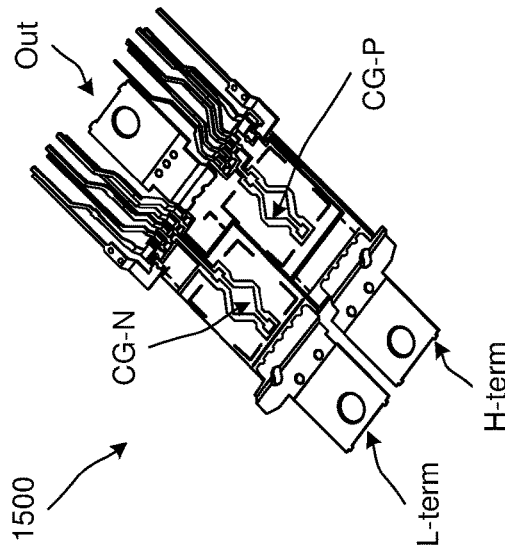
Figure 19C:
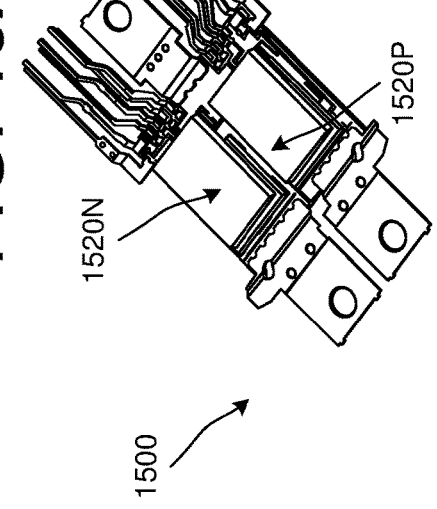

FIGS. 19A through 19D are diagrams that illustrate a method of manufacturing the devices described herein. Not all of the elements are labeled in each view. As shown in FIG. 19A, in this implementation, a leadframe structure can include common gate conductors CG-P, CG-N. The common gate conductors CG-P, CG-N can be included in a metal layer of a substrate, or can be included in the inner packages 1510N, 1510P. FIG. 19B illustrates the inner packages 1510N, 1510P and spacers 1521N, 1521P included in the module 1500. FIG. 19C illustrates the spacers 1520N, 1520P coupled to the inner packages 1510N, 1510P and the spacers 1521N, 1521P. FIG. 19D illustrates the substrate 1583 coupled to the spacers 1520N, 1520P. Encapsulation within a molding layer is not shown in these figures. Although FIGS. 18A through 19D are illustrated with semiconductor die in a diamond configuration, the rectangular or U-shape configuration can be implemented as well.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Implementations may be implemented in a computing system that includes a back end component, e.g., as a data server, or that includes a middleware component, e.g., an application server, or that includes a front end component, e.g., a client computer having a graphical user interface or a Web browser through which a user can interact with an implementation, or any combination of such back end, middleware, or front end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (S1), Galium Arsenide (GaAs), Galium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
   an inner package including:
     a first silicon carbide die having a die gate conductor coupled to a common gate conductor, and
     a second silicon carbide die having a die gate conductor coupled to the common gate conductor,
   an outer package including:
     a substrate coupled to the common gate conductor, and
     at least one clip coupled to the inner package and coupled to the substrate.

2. The apparatus of claim 1, wherein the substrate includes a gate metal runner in a metal layer of the substrate coupled to the common gate conductor in the inner package.

3. The apparatus of claim 1, wherein the at least one clip is coupled to a top side of the inner package and a metal layer of the substrate.

4. The apparatus of claim 3, wherein the substrate includes a gate metal runner in the metal layer of the substrate, the metal layer of the substrate is coupled to the common gate conductor in the inner package.

5. The apparatus of claim 1, wherein the substrate includes a dielectric disposed between metal layers.

6. The apparatus of claim 1, wherein the outer package includes a lead extending outside of the outer package.

7. The apparatus of claim 6, wherein the lead is electrically coupled to the inner package via the at least one clip.

8. The apparatus of claim 1, wherein the substrate is a first substrate coupled to a bottom side of the at least one clip, the apparatus further comprising:
 a second substrate coupled to a top side of the at least one clip.

9. The apparatus of claim 1, wherein the substrate has an opening configured to facilitate cooling.

10. The apparatus of claim 1, wherein the at least one clip has a first portion aligned orthogonal to a second portion of the at least one clip.

11. The apparatus of claim 1, wherein the substrate includes a gate metal runner in a metal layer of the substrate coupled to the common gate conductor in the inner package,
 the inner package includes a first conductive path between the gate metal runner and the gate conductor of the first silicon carbide die, and a second conductive path between the gate metal runner and the gate conductor of the second silicon carbide die, the first conductive path has a length substantially equal to a length of the second conductive path.

12. The apparatus of claim 1, wherein the first silicon carbide die and the second silicon carbide die are aligned along the same plane, the first silicon carbide die having an edge parallel to or non-parallel to an edge of the second silicon carbide die.

13. The apparatus of claim 1, wherein the first silicon carbide die and the second silicon carbide die are aligned along the same plane,
 the apparatus further comprising:
 a diode aligned along the same plane, the first silicon carbide die and the second silicon carbide die being disposed between the diode and the common gate conductor.

14. An apparatus, comprising:
 an inner package encapsulating in an insulator:
  at least a portion of a conductive metal layer including a common gate conductor, and
  a plurality of semiconductor die coupled to the common gate conductor of the conductive metal layer, the plurality of semiconductor die including a first silicon carbide die and a second silicon carbide die; and
 an outer package encapsulating:
  the inner package,
  a substrate coupled to the common gate conductor, and
  at least one clip, coupled to the inner package and coupled to the substrate.

15. The apparatus of claim 14, wherein the conductive metal layer includes a first conductive path between the common gate conductor and a die gate conductor of the first silicon carbide die, and a second conductive path between the common gate conductor and a die gate conductor of the second silicon carbide die.

16. The apparatus of claim 14, wherein the plurality of semiconductor die are defined in a diamond configuration.

17. An apparatus, comprising:
 an outer package including:
  a gate metal runner within a substrate, and
  at least one clip;
 an inner package disposed in the outer package and including:
  a first silicon carbide die having a gate conductor, and
  a second silicon carbide die having a gate conductor,
  a first conductive path between the gate metal runner and the gate conductor of the first silicon carbide die,
  a second conductive path between the gate metal runner and the gate conductor of the second silicon carbide die,
 the inner package being electrically coupled to the substrate of the outer package via the at least one clip.

18. The apparatus of claim 17, wherein the first silicon carbide die and the second silicon carbide die are aligned along the same plane and are electrically coupled to a leadframe of the inner package, the gate metal runner is electrically coupled to the leadframe.

19. The apparatus of claim 17, wherein the gate conductor of the first silicon carbide die is oriented with respect to the gate metal runner so that a length of the first conductive path is minimized.

20. The apparatus of claim 17, wherein the substrate is a first substrate coupled to a bottom side of the at least one clip,
 the apparatus further comprising:
 a second substrate coupled to a top side of the at least one clip.

* * * * *